(12) United States Patent
Lee et al.

(10) Patent No.: US 11,563,005 B2
(45) Date of Patent: Jan. 24, 2023

(54) THREE-DIMENSIONAL SEMICONDUCTOR DEVICE WITH A BIT LINE PERPENDICULAR TO A SUBSTRATE

(71) Applicant: SAMSUNG ELECTRONICS CO., LTD., Suwon-si (KR)

(72) Inventors: Minsu Lee, Seongnam-si (KR); Kiseok Lee, Hwaseong-si (KR); Minwoo Song, Seongnam-si (KR); Hyun-Sil Oh, Hwaseong-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 16/930,398

(22) Filed: Jul. 16, 2020

(65) Prior Publication Data

US 2021/0183861 A1 Jun. 17, 2021

(30) Foreign Application Priority Data

Dec. 12, 2019 (KR) .................. 10-2019-0165786

(51) Int. Cl.
*H01L 27/108* (2006.01)
*G11C 8/14* (2006.01)
*G11C 7/18* (2006.01)

(52) U.S. Cl.
CPC .......... *H01L 27/10805* (2013.01); *G11C 7/18* (2013.01); *G11C 8/14* (2013.01)

(58) Field of Classification Search
CPC ........... H01L 27/10805; H01L 27/1085; H01L 27/10873; H01L 27/10885; H01L 27/10882; H01L 27/11514; G11C 7/18; G11C 8/14; G11C 11/4097
See application file for complete search history.

(56) References Cited

U.S. PATENT DOCUMENTS

| | | | |
|---|---|---|---|
| 10,014,318 B2 | 7/2018 | Or-Bach et al. | |
| 10,153,281 B2 | 12/2018 | Derner et al. | |
| 10,229,874 B1 | 3/2019 | Ramaswamy | |
| 2013/0052803 A1* | 2/2013 | Roizin | H01L 29/66825 |
| | | | 257/E21.09 |
| 2019/0006376 A1 | 1/2019 | Ramaswamy | |
| 2019/0074277 A1 | 3/2019 | Ramaswamy | |
| 2019/0103407 A1 | 4/2019 | Kim et al. | |
| 2019/0109196 A1* | 4/2019 | Sonehara | H01L 27/1158 |
| 2019/0164985 A1 | 5/2019 | Lee et al. | |
| 2019/0206869 A1 | 7/2019 | Kim et al. | |
| 2020/0227416 A1* | 7/2020 | Lilak | H01L 27/1085 |
| 2022/0077151 A1* | 3/2022 | Lee | H01L 27/10897 |

* cited by examiner

*Primary Examiner* — Jerome Leboeuf
(74) *Attorney, Agent, or Firm* — Lee IP Law, P.C.

(57) ABSTRACT

A three-dimensional semiconductor device includes a first channel pattern on and spaced apart from a substrate, the first channel pattern having a first end and a second end that are spaced apart from each other in a first direction parallel to a top surface of the substrate, and a first sidewall and a second sidewall connecting between the first end and the second end, the first and second sidewalls being spaced apart from each other in a second direction parallel to the top surface of the substrate, the second direction intersecting the first direction, a bit line in contact with the first end of the first channel pattern, the bit line extending in a third direction perpendicular to the top surface of the substrate, and a first gate electrode adjacent to the first sidewall of the first channel pattern.

20 Claims, 33 Drawing Sheets

THREE-DIMENSIONAL SEMICONDUCTOR DEVICE WITH A BIT LINE PERPENDICULAR TO A SUBSTRATE

CROSS-REFERENCE TO RELATED APPLICATION

Korean Patent Application No. 10-2019-0165786, filed on Dec. 12, 2019, in the Korean Intellectual Property Office, and entitled: "Three-Dimensional Semiconductor Device," is incorporated by reference herein in its entirety.

BACKGROUND

1. Field

Example embodiments relate to a three-dimensional semiconductor device.

2. Description of the Related Art

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Structures of semiconductor devices are gradually increasing in complexity and integration to meet these requested characteristics.

SUMMARY

According to some example embodiments, a three-dimensional semiconductor device may include a first channel pattern disposed on and spaced apart from a substrate, the first channel pattern including a first end and a second end that are spaced apart from each other in a first direction parallel to a top surface of the substrate, and a first sidewall and a second sidewall between the first end and the second end, the first and second sidewalls being spaced apart from each other in a second direction parallel to the top surface of the substrate, the second direction intersecting the first direction; a bit line in contact with the first end of the first channel pattern, the bit line extending in a third direction perpendicular to the top surface of the substrate; and a first gate electrode adjacent to the first sidewall of the first channel pattern.

According to some example embodiments, a three-dimensional semiconductor device may include a channel pattern that extends in a first direction perpendicular to a top surface of a substrate, the channel pattern including a first sidewall and a second sidewall that are spaced apart from each other in a second direction intersecting the first direction, the second direction being parallel to the top surface of the substrate, and a third sidewall and a fourth sidewall that are spaced apart from each other in a third direction intersecting the second direction, the third direction being parallel to the top surface of the substrate; a plurality of gate electrodes that are adjacent to the first sidewall of the channel pattern and are spaced apart from each other in the first direction; and a bit line that contacts the third sidewall of the channel pattern and extends in the first direction.

According to some example embodiments, a three-dimensional semiconductor device may include a first bit line and a second bit line that extend in a first direction perpendicular to a top surface of a substrate and are spaced apart from each other in a second direction parallel to the top surface of the substrate; a word line at a certain height from the top surface of the substrate, the word line extending in the second direction; a first channel pattern on the top surface of the substrate and at a height at which the word line is located, the first channel pattern being in contact with the first bit line; and a second channel pattern on the top surface of the substrate and at a height at which the word line is located, the second channel pattern being in contact with the second bit line. The word line may include a first word-line protrusion between the first channel pattern and the second channel pattern. The first word-line protrusion may be closer to the first channel pattern than to the second channel pattern.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
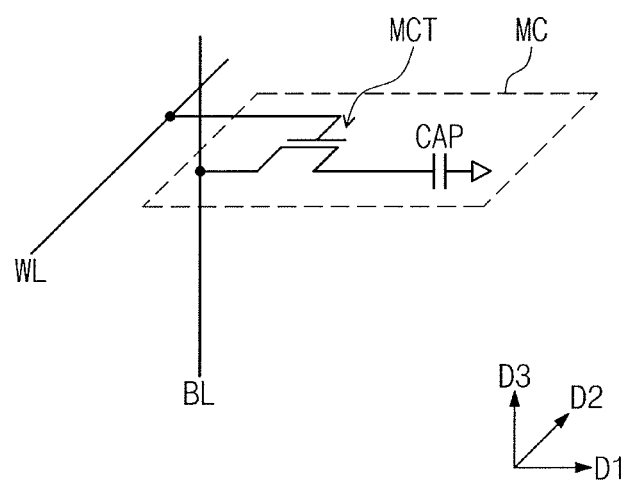
FIG. 1 illustrates a circuit diagram showing a three-dimensional semiconductor device according to some example embodiments.

FIG. 1 illustrates a circuit diagram showing a three-dimensional semiconductor device according to some example embodiments.

Referring to FIG. 1, a semiconductor device according to the present embodiment may include a unit memory cell transistor MCT between a bit line BL and a word line WL that intersect each other, e.g., the bit line BL and word line WL extend along intersecting directions. A gate of the memory cell transistor MCT may be connected to the word line WL, and a source of the memory cell transistor MCT may be connected to the bit line BL. A drain of the memory cell transistor MCT may be connected to a capacitor CAP. One memory cell transistor MCT and one capacitor CAP may constitute a single memory cell MC. The bit line BL may vertically extend along a third direction D3, and the word line WL may horizontally extend along a second direction D2. The capacitor CAP may be replaced with any data storage element. The data storage element may be, e.g., a memory element using one of a magnetic tunnel junction pattern and a variable resistance body that includes a phase change material.

Figure 2:
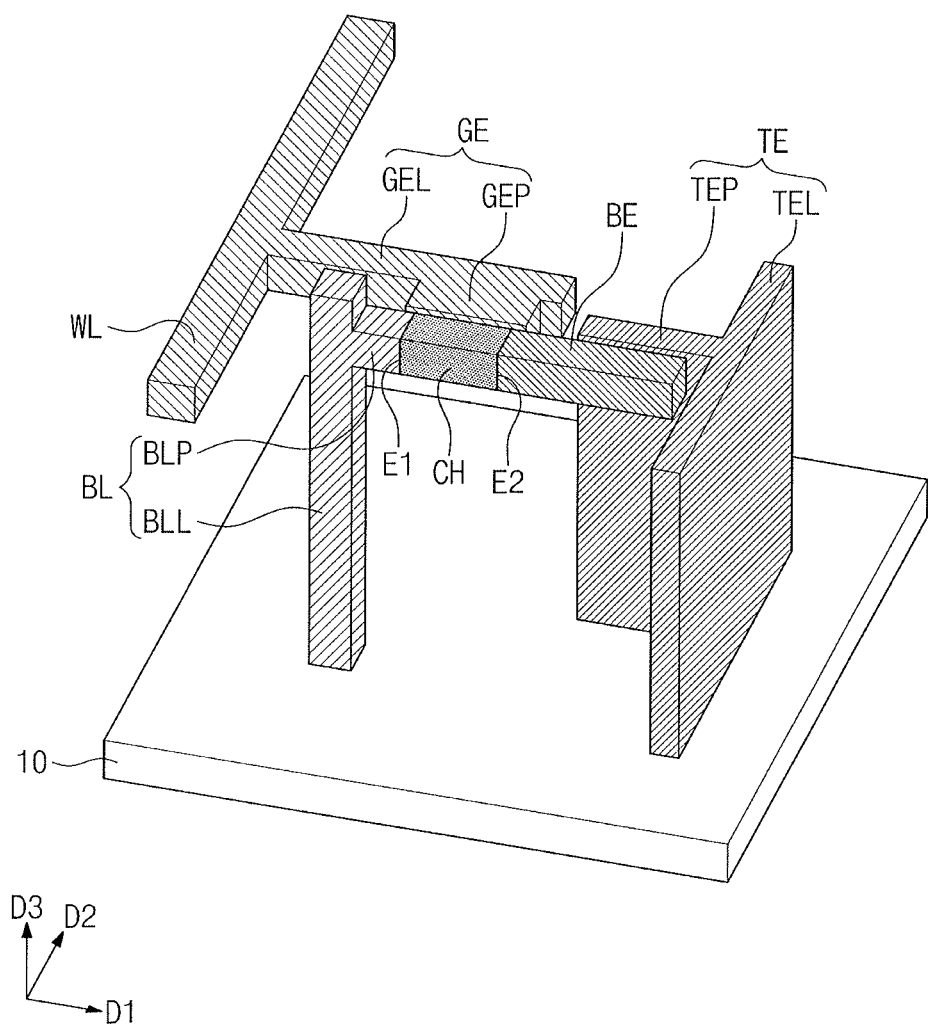
FIG. 2 illustrates a perspective view showing a three-dimensional semiconductor device according to some example embodiments.

FIG. 2 illustrates a perspective view showing a three-dimensional semiconductor device according to some example embodiments.

Referring to FIG. 2, a channel pattern CH may be disposed on a substrate 10. The substrate 10 may be, e.g., a single-crystalline silicon substrate, a silicon-on-insulator (SOI) substrate, or a layer or substrate formed of a semiconductor material other than silicon. The channel pattern CH may be spaced apart from the substrate 10, e.g., along the third direction D3. The channel pattern CH may be insulated from the substrate 10. The channel pattern CH may include, e.g., an oxide semiconductor material. The oxide semiconductor material may include one or more of, e.g., indium (In), gallium (Ga), zinc (Zn), and tin (Sn). The oxide semiconductor material may be, e.g., indium-gallium-zinc oxide (IGZO) that includes indium (In), gallium (Ga), and zinc (Zn). The oxide semiconductor material may be, e.g., amorphous indium-gallium-zinc oxide (IGZO). The channel pattern CH may include a first end E1 and a second end E2 that are spaced apart from each other in a first direction D1 parallel to a top surface of the substrate 10.

Between the first end E1 and the second end E2 of the channel pattern CH, a gate electrode GE may be adjacent to one sidewall of the channel pattern CH, e.g., the gate electrode GE may be adjacent to and face a sidewall of the channel pattern CH connecting between the first end E1 and the second end E2. A gate dielectric layer may be interposed between the gate electrode GE and the channel pattern CH. The gate electrode GE may be located at a height from the top surface of the substrate 10 that is the same as or similar to a height at which the channel pattern CH is positioned. The gate electrode GE may be connected to the word line WL that extends in the second direction D2, which intersects the first direction D1 and is parallel to the top surface of the substrate 10. The gate electrode GE may include a gate line part GEL that extends in the first direction D1 and contacts the word line WL, and also may include a gate extension GEP that protrudes from the gate line part GEL toward the channel pattern CH. The gate electrode GE and the word line WL may be integrally formed into a single body, e.g., the gate extension GEP and the gate line part GEL of the gate electrode GE may be integral with the word line WL to define a single and seamless structure. The gate electrode GE may also be referred to or described as either a portion of the word line WL or a word-line protrusion.

The first end E1 of the channel pattern CH may contact the bit line BL. The bit line BL may include a bit-line line part BLL that extends in the third direction D3 perpendicular to the top surface of the substrate 10, and also may include a bit-line protrusion BLP that protrudes in the first direction D1 from a sidewall of the bit-line line part BLL and contacts the first end E1. The bit-line line part BLL and the bit-line protrusion BLP may be integrally formed into a single body. The bit line BL may be spaced apart from the substrate 10. Alternatively, the bit line BL may be connected to a source/drain of a bit-line selection transistor disposed on the substrate 10. The bit line BL and the word line WL may be spaced apart from each other, e.g., along the first direction D1.

The second end E2 of the channel pattern CH may contact a first electrode BE. The first electrode BE may be adjacent to a second electrode TE. The second electrode TE may include an electrode line part TEL that extends in the second direction D2, and may also include at least one electrode protrusion TEP that protrudes from the electrode line part TEL toward and along, e.g., and adjoins, a sidewall of the first electrode BE. A dielectric layer may be interposed between the first electrode BE and the second electrode TE. The first electrode BE, the second electrode TE, and the dielectric layer may constitute a capacitor. The second electrode TE may be spaced apart from the substrate 10. The channel pattern CH and its adjacent gate electrode GE may constitute the single unit memory cell transistor MCT of FIG. 1.

The first electrode BE may have a bar shape, a plug shape, or a hollow cylindrical shape. When the first electrode BE has a hollow cylindrical shape, the electrode protrusion TEP of the second electrode TE may be inserted into the first electrode BE. The bit line BL, the word line WL, the gate electrode GE, the first electrode BE, and the second electrode TE may include one or more of doped polysilicon, metal, e.g., at least one of tungsten, copper, aluminum, ruthenium, titanium, tantalum, or a combination thereof, and metal nitride including the aforementioned metal. The semiconductor device of FIG. 2 may be provided in plural, and the plurality of semiconductor devices may be arranged parallel to or symmetrically with each other.

Figure 3:
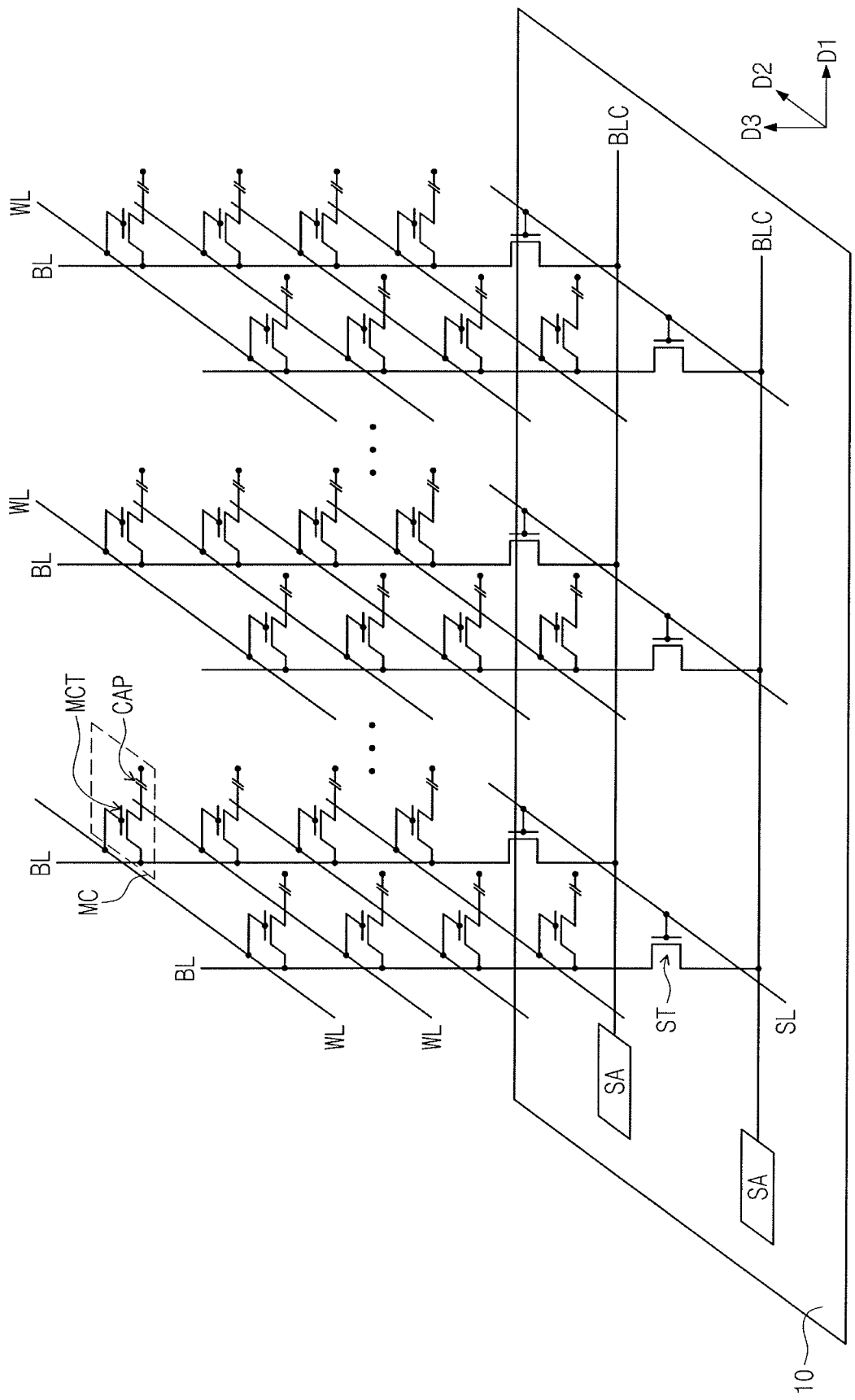
FIG. 3 illustrates a circuit diagram showing a three-dimensional semiconductor device according to some example embodiments.

FIG. 3 illustrates a circuit diagram showing a three-dimensional semiconductor device according to some example embodiments. FIG. 3 shows that a plurality of semiconductor devices, each having the circuit illustrated in FIG. 1, are arranged in the first, second, and third directions D1, D2, and D3.

Referring to FIG. 3, a plurality of the bit lines BL may vertically extend in the third direction D3 from the top surface of a substrate 10. The bit lines BL may be arranged in the first and second directions D1 and D2. A single bit line BL may intersect a plurality of the word lines WL that extend in the second direction D2. Memory cells MC may be disposed on corresponding intersections between the bit line BL and the word lines WL. The memory cells MC may each include the memory cell transistor MCT and the capacitor CAP. The bit lines BL may be correspondingly connected to first terminals of bit-line selection transistors ST adjacent to the substrate 10. The bit-line selection transistors ST straightly arranged along the second direction D2 may have their second terminals connected to corresponding bit-line connection lines BLC. The bit-line selection transistors ST straightly arranged along the second direction D2 may also have their gates connected to a corresponding bit-line selection line SL. The bit-line selection line SL may extend in the second direction D2. The bit-line connection lines BLC may extend in the first direction D1 and may be spaced apart from each other in the second direction D2. The bit-line connection lines BLC may be adjacent to the top surface of the substrate 10. The bit-line connection lines BLC may be connected to corresponding sense amplifier circuits SA. Because the bit lines BL are perpendicular to the substrate 10, it may be easy to connect ends of the bit lines BL to the bit-line connection lines BLC. In addition, it may be easy to form the bit lines BL having constant first lengths and to form the bit-line connection lines BLC having constant second lengths.

If the bit lines BL were not disposed to extend perpendicularly to the top surface of the substrate 10, e.g., in the case where the bit lines BL were to extend in parallel to the top surface of the substrate 10, the ends of the bit lines BL would have been required to have a stepwise shape for connecting the bit lines BL to the sense amplifier circuit SA. In this case, the bit lines BL would have had different lengths from each other, thereby causing signal disturbance and/or signal noise due to the difference in length, which in turn, would have reduced the reliability of the semiconductor devices.

In contrast, the bit lines BL in the semiconductor device according to some example embodiments are perpendicular to the substrate 10, thereby facilitating connection to the sense amplifier circuit SA via the bit-line connection lines BLC, while maintaining constant lengths. As such, reliability of semiconductor devices according to example embodiments may be increased.

Figure 4:
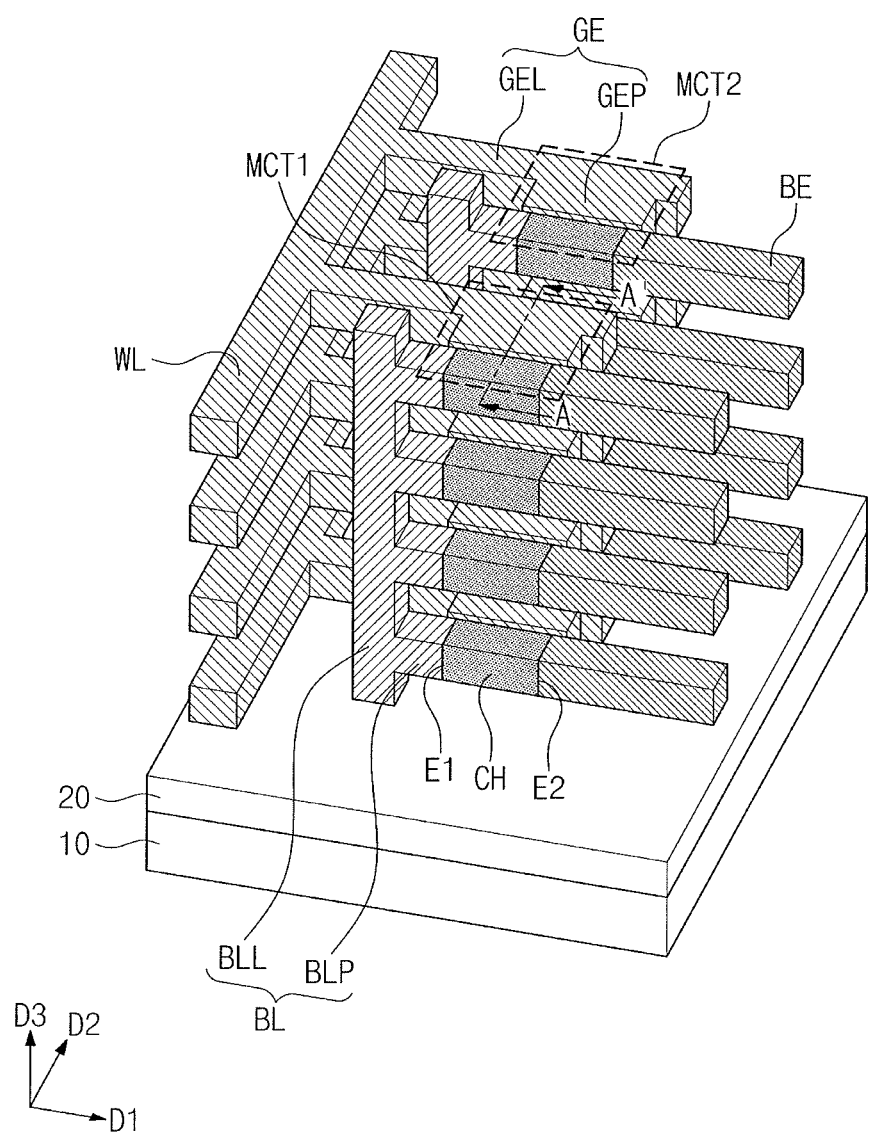
FIG. 4 illustrates a perspective view showing a three-dimensional semiconductor device according to some example embodiments.
Figure 5:
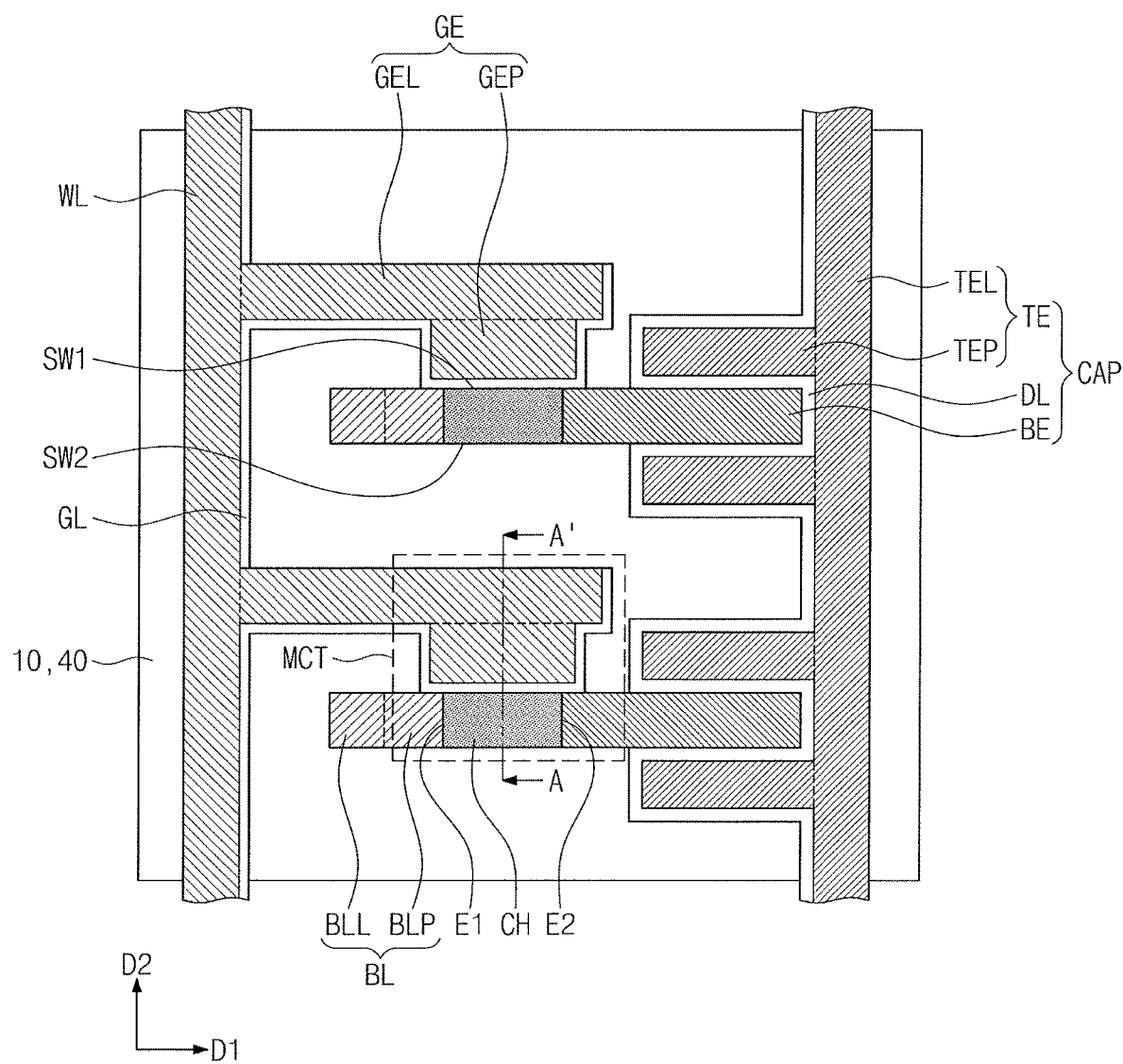
FIG. 5 illustrates a plan view showing a three-dimensional semiconductor device according to some example embodiments.
Figure 6:
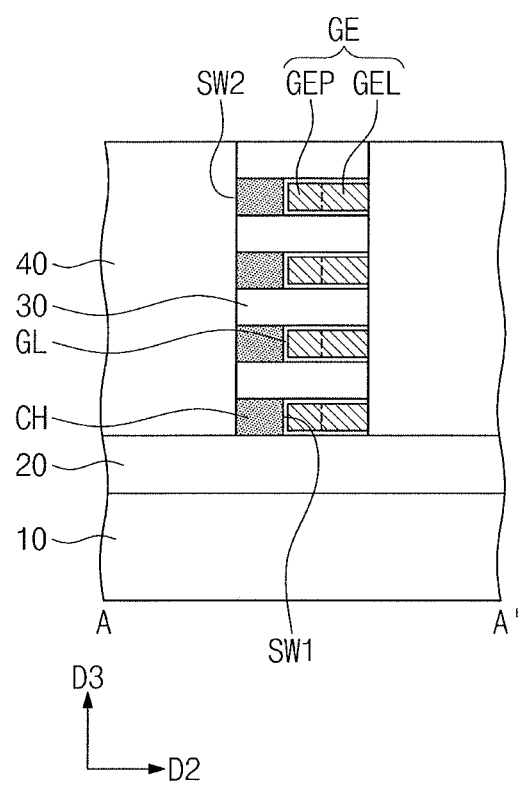
FIG. 6 illustrates a cross-sectional view taken along line I-I' of FIG. 4 or 5.

FIG. 4 illustrates a perspective view showing a three-dimensional semiconductor device according to some example embodiments. FIG. 5 illustrates a plan view showing a three-dimensional semiconductor device according to some example embodiments. FIG. 6 illustrates a cross-sectional view taken along line I-I' of FIG. 4 or 5. FIGS. 4 to 6 partially show a semiconductor device having the circuit illustrated in FIG. 3. For clarity of illustration, FIG. 4 omits depicting a gate dielectric layer GL, a second electrode TE, a dielectric layer DL, and a buried dielectric layer 40.

Referring to FIGS. 3 and 6, a semiconductor device according to the present embodiment may include a plurality of the bit lines BL that extends in the third direction D3 on the substrate 10. A lower interlayer dielectric layer 20 may be interposed between the substrate 10 and the bit lines BL. The lower interlayer dielectric layer 20 may have a single-layered or multi-layered structure including one or more of, e.g., a silicon oxide layer, a silicon nitride layer, a silicon oxynitride layer, and a porous dielectric layer. The lower interlayer dielectric layer 20 may entirely cover a top surface of the substrate 10. Although not shown, the substrate 10 may be provided thereon with the bit-line selection transistors ST of FIG. 3, and the lower interlayer dielectric layer 20 may cover the bit-line selection transistors ST. Ends of the bit lines BL may penetrate the lower interlayer dielectric layer 20 and have electrical connection with source/drain regions of the bit-line selection transistors ST. The lower interlayer dielectric layer 20 may be provided therein with the bit-line connection lines BLC and the bit-line selection lines SL of FIG. 3.

The bit lines BL may be two-dimensionally arranged, e.g., to be spaced apart from each other, along the first direction D1 and the second direction D2. A single bit line BL may include the bit-line line part BLL that extends in the third direction D3, and a plurality of the bit-line protrusions BLP that protrude in the first direction D1 from a sidewall of the bit-line line part BLL. For example, as illustrated in FIG. 4, the bit lines BL may each have a comb shape. In another example, the bit lines BL may not include the bit-line protrusions BLP, but may include only the bit-line line parts BLL.

The bit-line protrusions BLP may contact corresponding first ends E1 the of channel patterns CH. The second ends E2 of the channel patterns CH may contact corresponding first electrodes BE. Each of the channel patterns CH may have a first sidewall SW1 and a second sidewall SW2 that face each other between the first end E1 and the second end E2. A gate interlayer dielectric pattern 30 may be interposed between the channel patterns CH. The gate interlayer dielectric pattern 30 may have a single-layered or multi-layered structure including one or more of, e.g., a silicon oxide layer, a silicon nitride layer, a silicon oxynitride layer, and a porous dielectric layer.

The word lines WL may be stacked on the substrate 10. The word lines WL may be spaced apart from each other. The gate interlayer dielectric pattern 30 may be interposed between the word lines WL. The word lines WL may each extend in the second direction D2. A plurality of the gate electrodes GE may be connected to the word lines WL. The gate electrodes GE may each have the gate line part GEL that extends in the first direction D1 and contacts the word line WL, and the gate extension GEP that protrudes from the gate line part GEL toward the channel pattern CH. The word line WL and its corresponding gate electrodes GE may be integrally formed into a single body. The channel pattern CH may include, e.g., indium-gallium-zinc oxide (IGZO). The IGZO may serve as a channel at its portion adjacent to the gate electrode GE to which voltage is applied.

A gate dielectric layer GL may be interposed between the gate electrode GE and the first sidewall SW1 of the channel pattern CH. The gate dielectric layer GL may include one or more of, e.g., a silicon oxide layer and a high-k dielectric layer having a dielectric constant higher than that of silicon oxide. As shown in FIG. 6, the gate interlayer dielectric pattern 30 may extend into a gap between the gate electrodes GE. The gate dielectric layer GL may extend to intervene, e.g., separate, between the gate interlayer dielectric pattern 30 and the gate electrode GE.

The channel pattern CH at a certain height, the gate electrode GE adjacent to the channel pattern CH, and the gate dielectric layer GL between the channel pattern CH and the gate electrode GE may constitute the single unit memory cell transistor MCT of FIG. 3. As shown in FIG. 4, the gate electrode GE included in a first memory cell transistor MCT1 at a certain height may be positioned between the channel pattern CH included in the first memory cell transistor MCT1 and the channel pattern CH included in a second memory cell transistor MCT2 adjacent to the first memory cell transistor MCT1, e.g., along the second direction D2. The gate electrode GE included in the first memory cell transistor MCT1 may be closer to the channel pattern CH included in the first memory cell transistor MCT1 than to the channel pattern CH included in the second memory cell transistor MCT2.

The second electrode TE may be adjacent to the first electrodes BE. The second electrode TE may include the electrode line part TEL that extends in the second direction D2, and a plurality of the electrode protrusions TEP that protrude from the electrode line part TEL toward and along, e.g., and adjoin, a sidewall of the first electrode BE. A dielectric layer DL may be interposed between the first electrode BE and the second electrode TE. The first electrode BE, the second electrode TE, and the dielectric layer DL may constitute the capacitor CAP. The first electrode BE may be positioned between neighboring electrode protrusions TEP.

The lower interlayer dielectric layer 20 may be provided on the substrate 10 with a buried dielectric layer 40 that fills spaces between the word lines WL, the gate electrodes GE, the channel patterns CH, and the bit lines BL. The buried dielectric layer 40 may have a single-layered or multi-layered structure including one or more of, e.g., a silicon oxide layer, a silicon nitride layer, a silicon oxynitride layer, and a porous dielectric layer. The second sidewalls SW2 of the channel patterns CH may, e.g., directly, contact the buried dielectric layer 40.

According to some embodiments, a semiconductor device may include the bit lines BL perpendicular to the top surface of the substrate 10, which may result in a relatively large interval between the bit lines BL, as compared to a case where the bit lines BL are stacked like the word lines WL. In addition, a shielding function may be imposed on the gate electrode GE and the word line WL that are positioned between the bit lines BL. As a result, parasitic capacitance between the bit lines BL may be reduced to prevent or minimize signal disturbance and/or signal noise and also to provide a semiconductor device with increased reliability.

FIGS. 7A to 7M illustrate perspective views showing stages in a method of fabricating the three-dimensional semiconductor device of FIG. 5, according to some example embodiments.

Figure 7A:
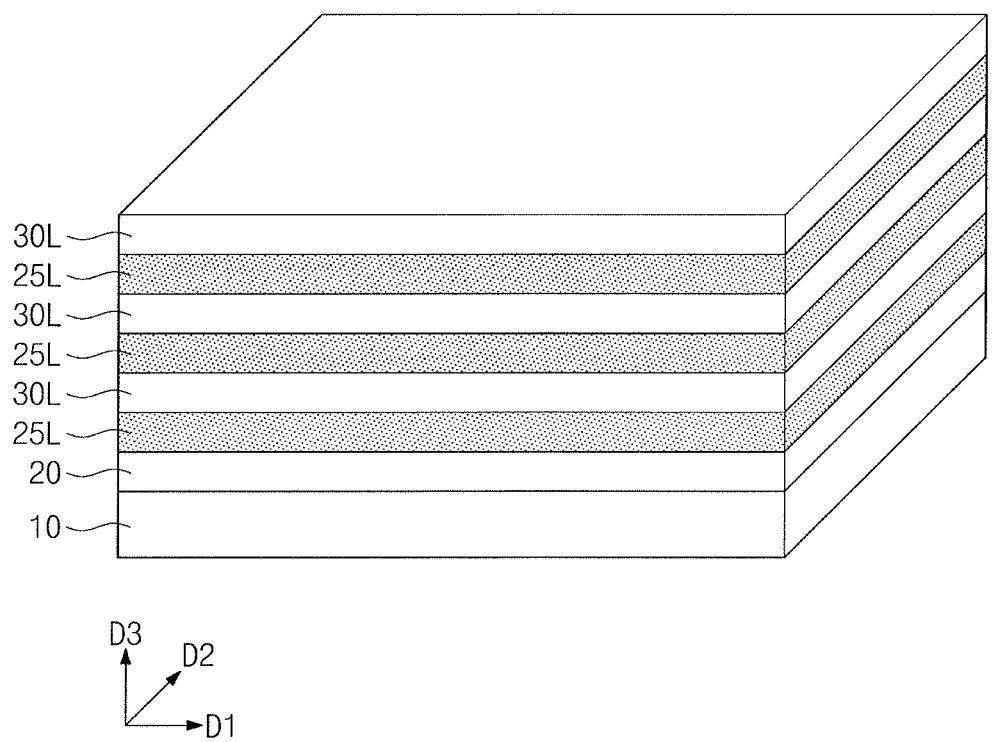
FIGS. 7A to 7M illustrate perspective views showing stages in a method of fabricating the three-dimensional semiconductor device of FIG. 5, according to some example embodiments.

Referring to FIG. 7A, the lower interlayer dielectric layer 20 may be formed on the substrate 10. Sacrificial layers 25L and gate interlayer dielectric layers 30L may be alternately and repeatedly formed on the lower interlayer dielectric layer 20. The gate interlayer dielectric layer 30L may have a single-layered or multi-layered structure including one or more of, e.g., a silicon oxide layer, a silicon nitride layer, a silicon oxynitride layer, and a porous dielectric layer. The sacrificial layer 25L may include a material having an etch selectivity with respect to the gate interlayer dielectric layer 30L.

Figure 7B:
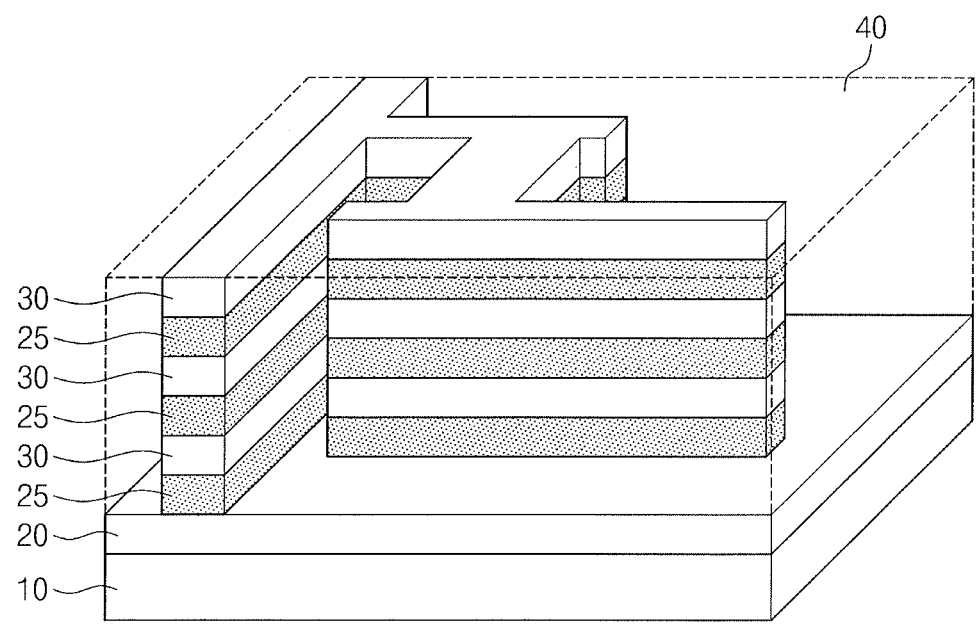

Referring to FIGS. 5 and 7B, a first mask pattern may be formed on the gate interlayer dielectric layer 30L at the top position. When viewed in plan view, the first mask pattern may have a shape that connects the word line WL, at least one gate electrode GE, the bit line BL, the channel pattern CH, and the first electrode BE illustrated in FIG. 5. The first mask pattern may be used as an etching mask through which the gate interlayer dielectric layers 30L and the sacrificial layers 25L are etched to respectively form gate interlayer dielectric patterns 30 and sacrificial patterns 25, and simultaneously to expose a top surface of the lower interlayer dielectric layer 20. the buried dielectric layer 40 may be formed on an entire surface of the substrate 10, and then a planarization etching process may be performed to expose a top surface of the gate interlayer dielectric pattern 30 at the top position. The buried dielectric layer 40 may fill spaces beside the sacrificial patterns 25 and the gate interlayer dielectric patterns 30.

Figure 7C:
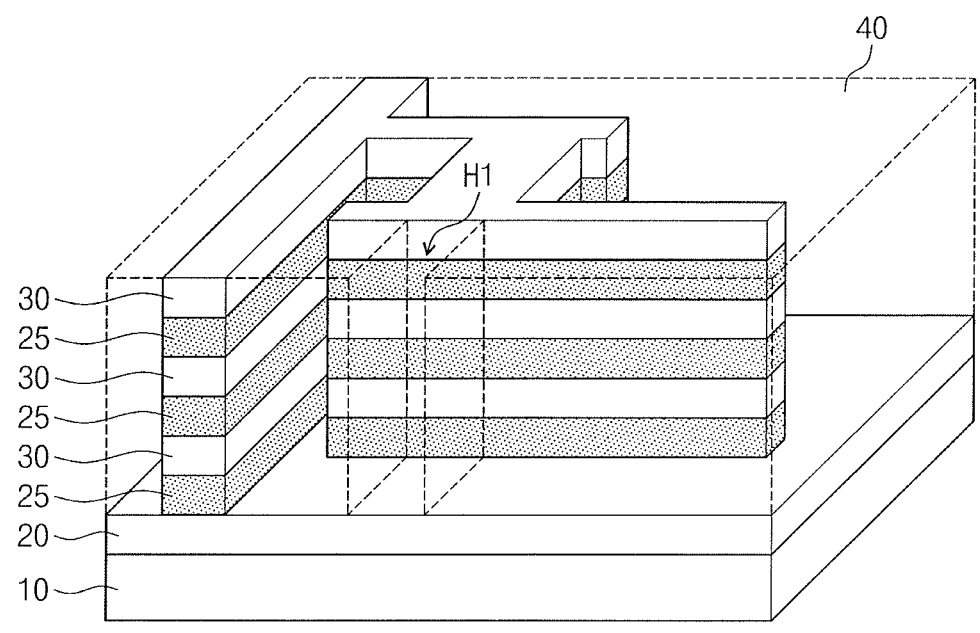
Figure 7C:
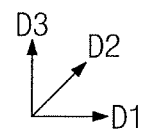

Referring to FIGS. 5 and 7C, a second mask pattern may be used to etch the buried dielectric layer 40 adjacent to a location where a channel pattern CH will be subsequently formed, and as a result, a first hole H1 may be formed to expose the top surface of the lower interlayer dielectric layer 20. The first hole H1 may expose sidewalls of the sacrificial patterns 25 and sidewalls of the gate interlayer dielectric patterns 30.

Figure 7D:
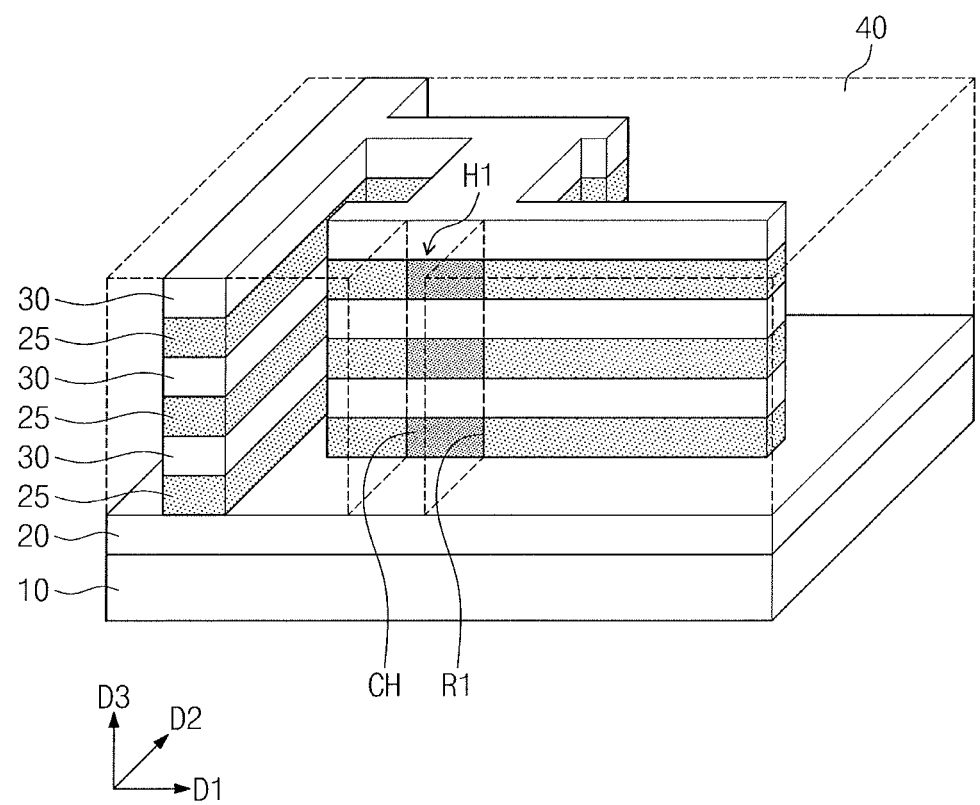

Referring to FIGS. 5, 7C, and 7D, an isotropic etching process may be performed to selectively remove portions of the sacrificial patterns 25 exposed to the first hole H1, thereby forming first recesses R1. At this stage, the gate interlayer dielectric patterns 30 may not be etched. The first recesses R1 may expose top and bottom surfaces of the gate interlayer dielectric patterns 30. A deposition process may be performed to form on the entire surface of the substrate 10 a channel layer that fills the first recesses R1, and then a blanket anisotropic etching process may be performed to leave channel patterns CH in the first recesses R1 and to completely remove the channel layer outside the first recesses R1.

Figure 7E:
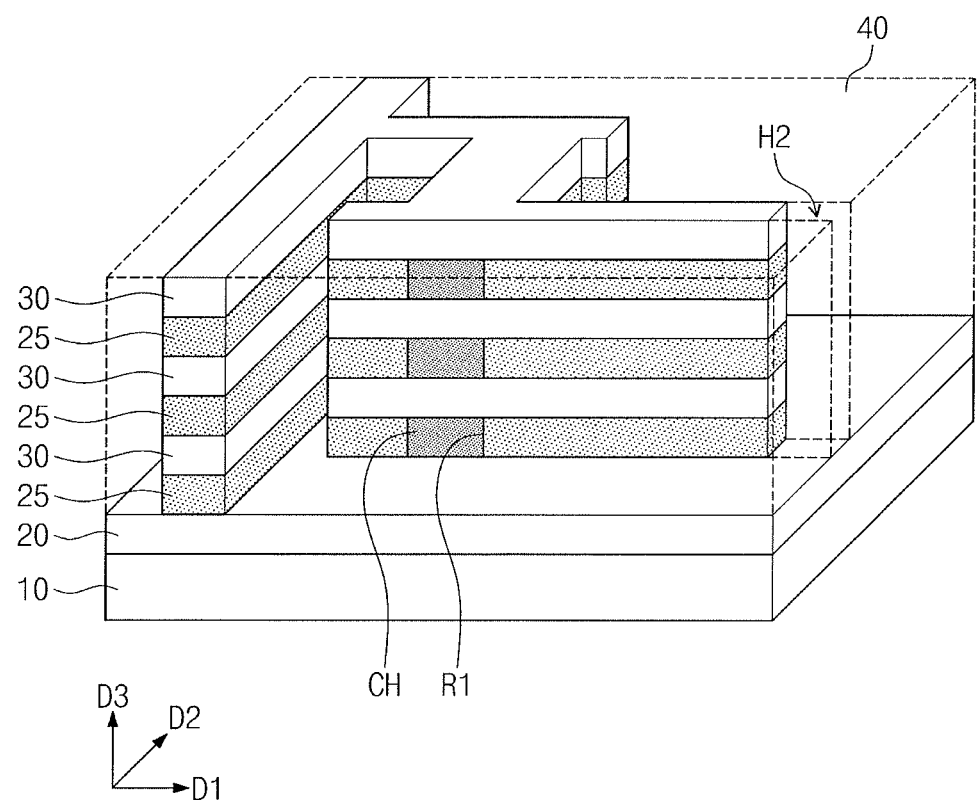

Referring to FIGS. 5, 7D, and 7E, the buried dielectric layer 40 may be additionally formed on the entire surface of the substrate 10 to thereby fill the first hole H1, and then a planarization etching process may be performed to expose the top surface of the gate interlayer dielectric pattern 30 at the top position. A third mask pattern may be used to etch the buried dielectric layer 40 adjacent to a location where an end of a first electrode BE is formed, and as a result, a second hole H2 may be formed to expose the top surface of the lower interlayer dielectric layer 20. The second hole H2 may expose sidewalls of the sacrificial patterns 25 and sidewalls of the gate interlayer dielectric patterns 30.

Figure 7F:
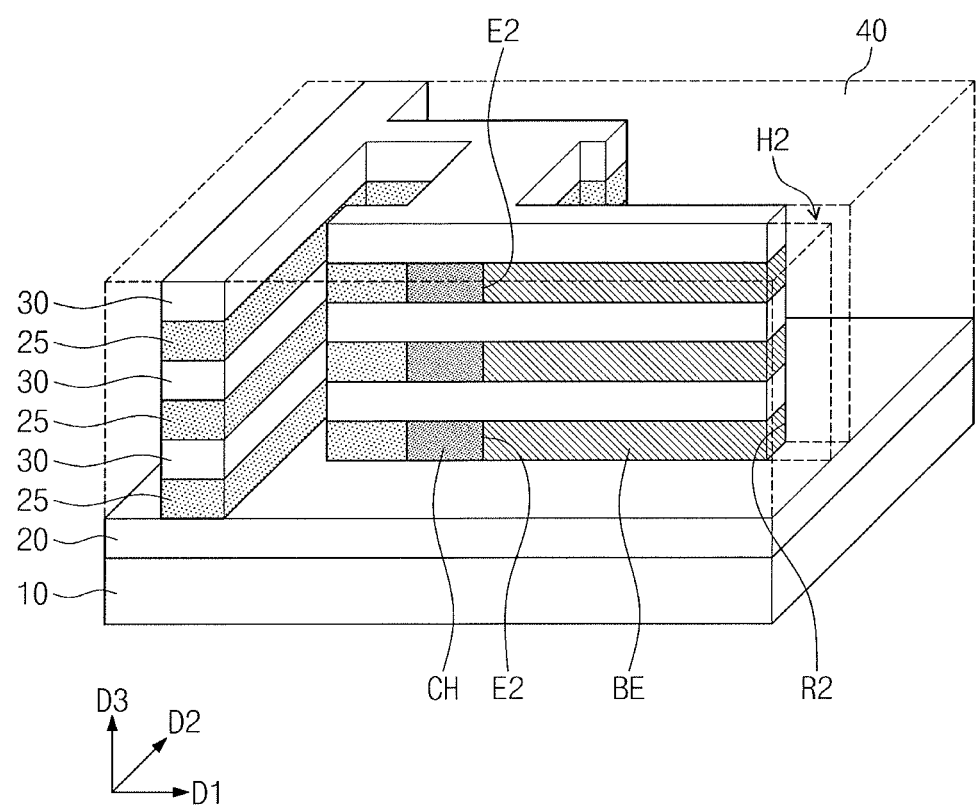

Referring to FIGS. 5, 7E, and 7F, an isotropic etching process may be performed to selectively remove portions of the sacrificial patterns 25 exposed to the second hole H2, thereby forming second recesses R2. At this stage, the gate interlayer dielectric patterns 30 may not be etched. The second recesses R2 may expose the top and bottom surfaces of the gate interlayer dielectric patterns 30. The second recesses R2 may expose second ends E2 of the channel patterns CH. The second recesses R2 may expose a sidewall of the buried dielectric layer 40. A deposition process may be performed to form on the entire surface of the substrate 10 a first electrode layer that fills the second recesses R2, and then a blanket anisotropic etching process may be performed to leave first electrodes BE in the second recesses R2 and to completely remove the first electrode layer outside the second recesses R2. At this stage, the first electrodes BE may be formed to have plug shapes or hollow cylindrical shapes, based on a thickness of the first electrode layer.

Figure 7G:
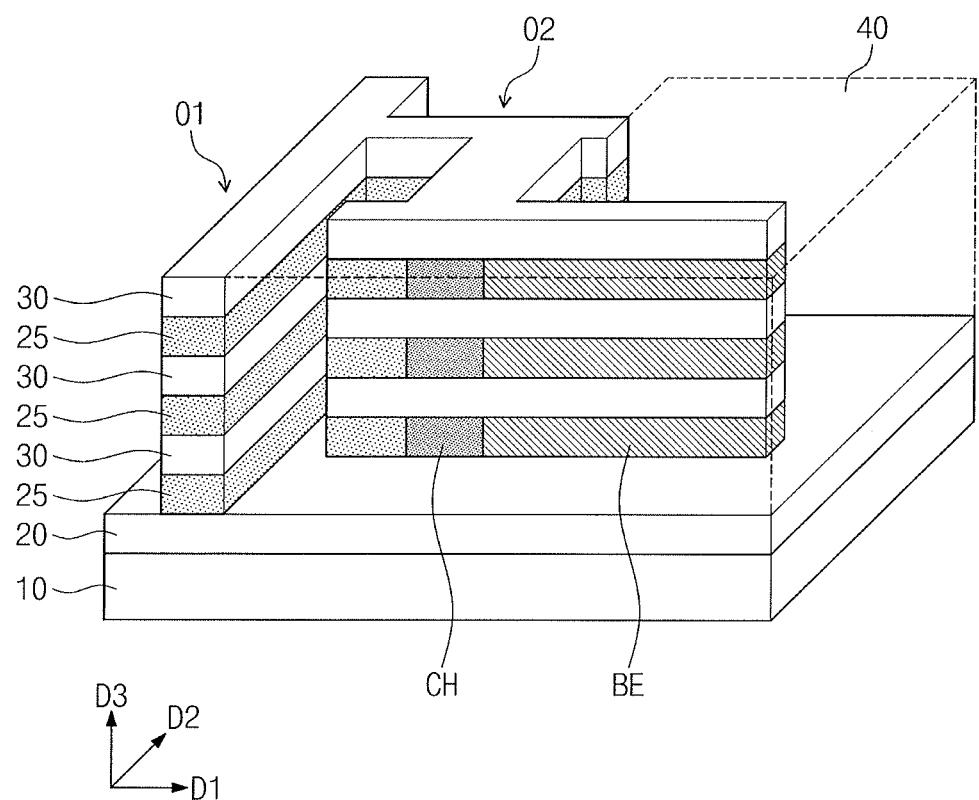

Referring to FIGS. 5, 7F, and 7G, the buried dielectric layer 40 may be additionally formed on the entire surface of the substrate 10 to thereby fill the second hole H2, and then a planarization etching process may be performed to expose the top surface of the gate interlayer dielectric pattern 30 at the top position. A fourth mask pattern may be used to etch the buried dielectric layer 40 adjacent to locations where a word line WL and a gate line part GEL will be subsequently formed, and as a result, a first opening O1 and a second opening O2 may be formed to expose the top surface of the lower interlayer dielectric layer 20. The first opening O1 may expose sidewalls of the sacrificial patterns 25 and sidewalls of the gate interlayer dielectric patterns 30, which patterns 25 and 30 are positioned at the location where a word line WL will be subsequently formed. The first opening O1 may have a groove shape that extends in a second direction D2. The second opening O2 may expose sidewalls of the sacrificial patterns 25 and sidewalls of the gate interlayer dielectric patterns 30, which patterns 25 and 30 are positioned at the location where a gate line part GEL will be subsequently formed.

Figure 7H:
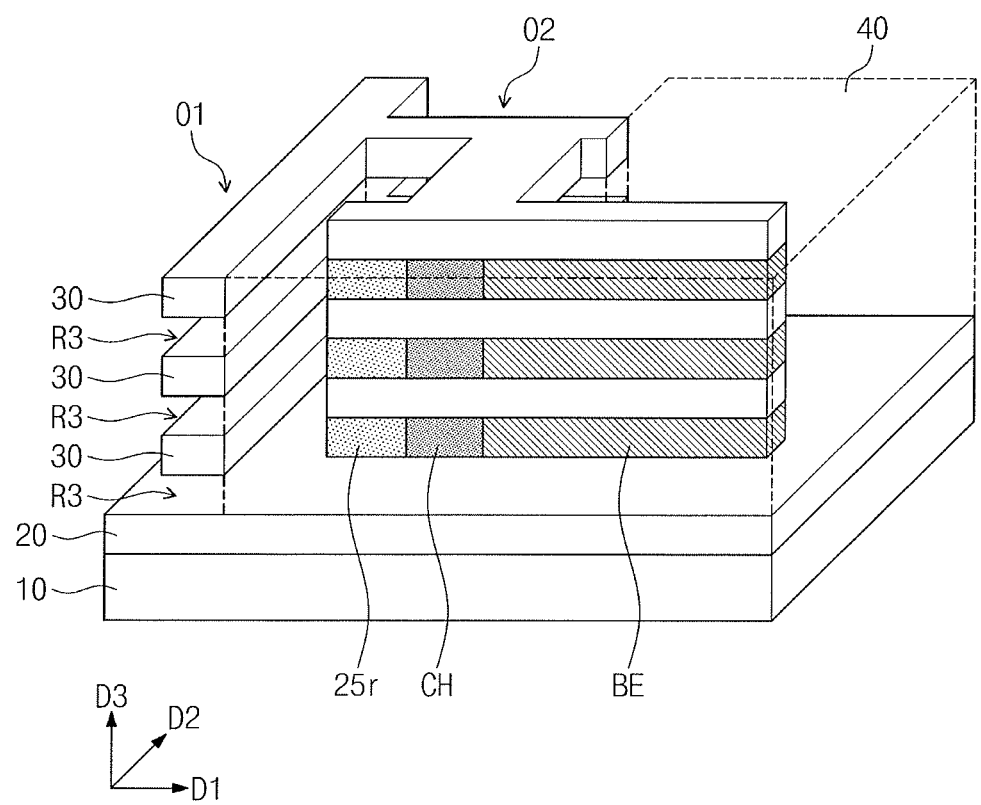

Referring to FIGS. 5, 7G, and 7H, an isotropic etching process may be performed to remove most of the sacrificial patterns 25 exposed to the first and second openings O1 and O2 to thereby form third recesses R3, thereby leaving residual sacrificial patterns 25r in contact with the channel patterns CH. At this stage, the gate interlayer dielectric patterns 30 may not be etched. The third recesses R3 may expose top and bottom surfaces of the gate interlayer dielectric patterns 30. The third recesses R3 may expose first sidewalls SW1 of the channel patterns CH. The third recesses R3 may expose a sidewall of the buried dielectric layer 40.

Referring to FIGS. 5, 6, 7H, and 7I, the gate dielectric layer GL may be conformally formed on the entire surface of the substrate 10, thereby covering inner walls of the third recesses R3 and the top and bottom surfaces of the gate interlayer dielectric patterns 30. The gate dielectric layer GL may contact the first sidewalls SW1 of the channel patterns CH. A gate electrode layer may be formed on the entire surface of the substrate 10, thereby filling the third recesses R3. An anisotropic etching process may be performed on the gate electrode layer and the gate dielectric layer GL, thereby removing the gate electrode layer and the gate dielectric layer GL from the first and second openings O1 and O2, leaving the gate dielectric layer GL in the third recesses R3, and forming a gate electrode GE and a word line WL. The anisotropic etching process may expose the top surface of the gate interlayer dielectric pattern 30 at the top position and a top surface of the buried dielectric layer 40.

Figure 7I:
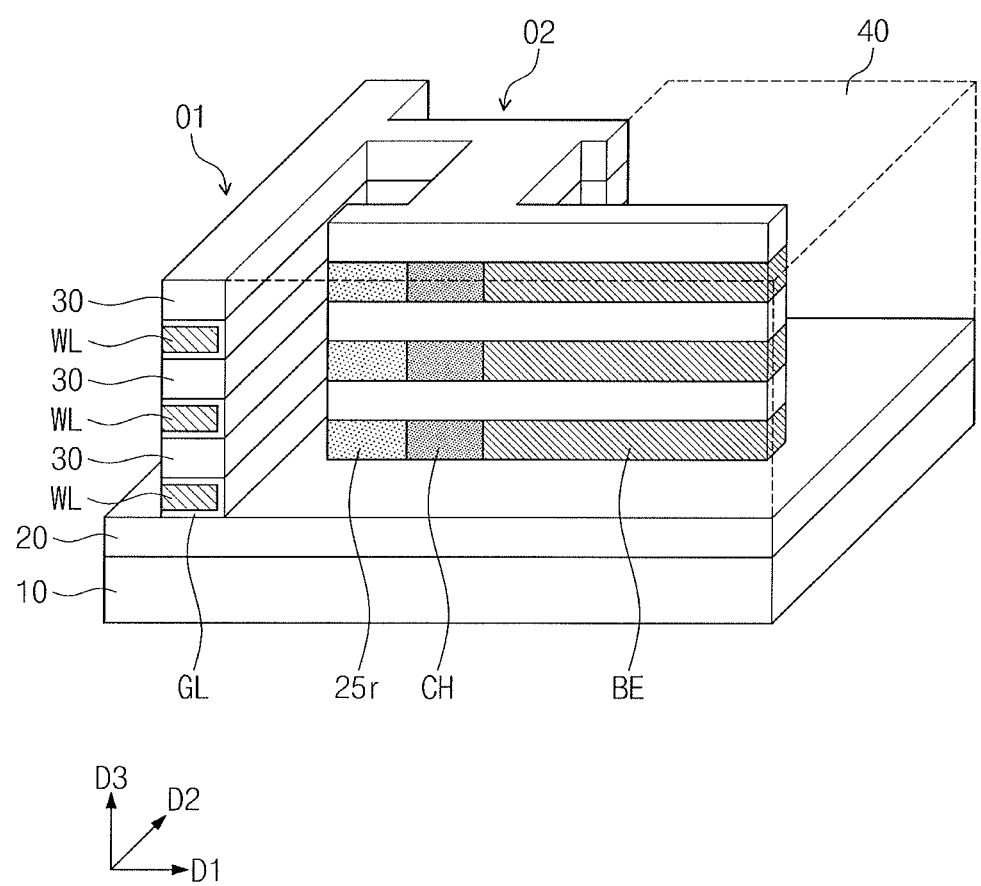
Figure 7J:
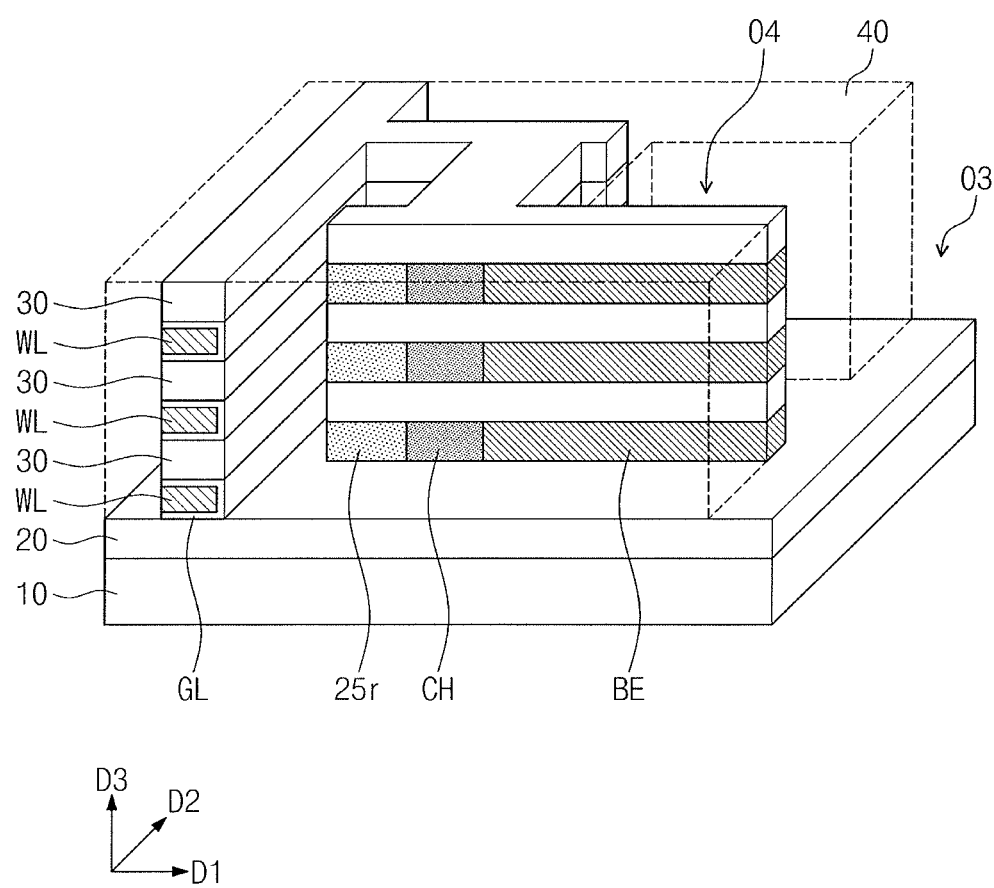

Referring to FIGS. 5, 7I, and 7J, the buried dielectric layer 40 may be additionally formed on the entire surface of the substrate 10 to thereby fill the first and second openings O1 and O2, and then a planarization etching process may be performed to expose the top surface of the gate interlayer dielectric pattern 30 at the top position. A fifth mask pattern may be used to etch the buried dielectric layer 40 adjacent to locations where the second electrode TE and the dielectric layer DL will be subsequently formed, and as a result, a third opening O3 and a fourth opening O4 may be formed to expose the top surface of the lower interlayer dielectric layer 20. The third opening O3 may be formed by etching the buried dielectric layer 40 at a location where an electrode line part TEL will be formed, and may have a groove shape that extends in the second direction D2. The third opening O3 may expose ends of the first electrodes BE and ends of the gate interlayer dielectric patterns 30. The fourth opening O4 may be formed by etching the buried dielectric layer 40 at a location where an electrode protrusion TEP will be subsequently formed, and may expose sidewalls of the first electrodes BE and sidewalls of the gate interlayer dielectric patterns 30.

Figure 7K:
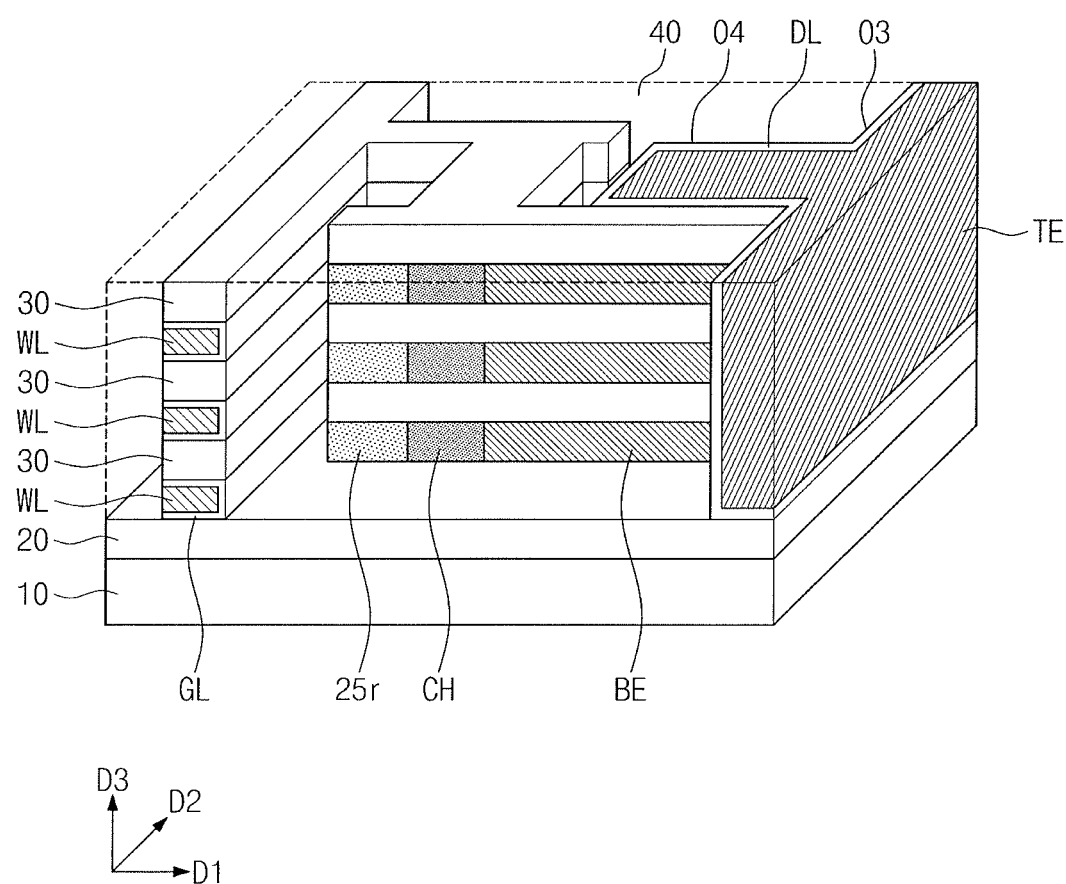

Referring to FIGS. 5, 7J, and 7K, the dielectric layer DL may be conformally formed on the entire surface of the substrate 10, thereby conformally covering inner walls of the third and fourth openings O3 and O4. The dielectric layer DL may cover the sidewalls and the ends of the first electrodes BE. A second electrode layer may be formed on the entire surface of the substrate 10 to thereby fill the third and fourth openings O3 and O4. A blanket etch-back process or a chemical mechanical polishing (CMP) process may be performed to expose the top surface of the buried dielectric layer 40, to form a second electrode TE in the third and fourth openings O3 and O4, and simultaneously to leave the dielectric layer DL in the third and fourth openings O3 and O4.

Before the dielectric layer DL is formed, the gate interlayer dielectric patterns 30 exposed to the third and fourth openings O3 and O4 may be partially removed to expose top and bottom surfaces of the first electrodes BE. Afterwards, when the dielectric layer DL and the second electrode TE are formed, the dielectric layer DL may cover the top and bottom surfaces of the first electrodes BE. In addition, a portion of the second electrode TE may be interposed between the first electrodes BE.

Figure 7L:
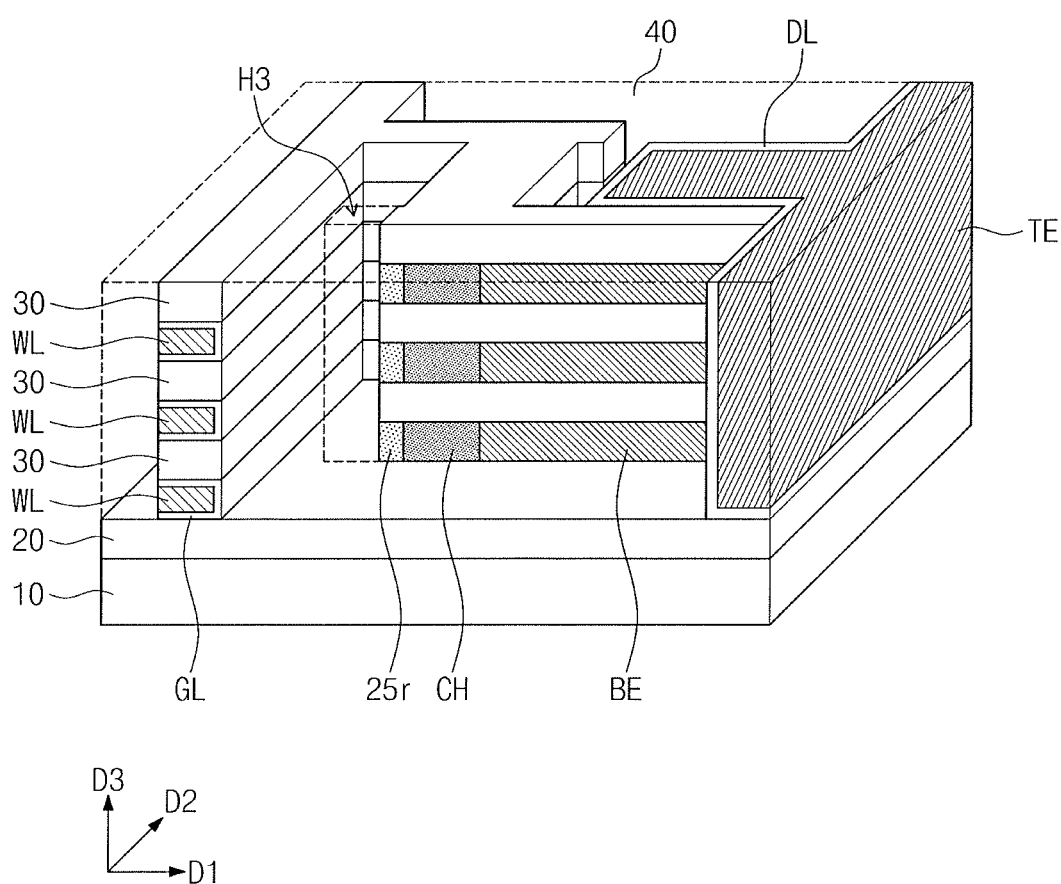

Referring to FIGS. 5, 7K, and 7L, a sixth mask pattern may be used to partially remove the gate interlayer dielectric patterns 30 at a location where a bit-line line part BLL will be subsequently formed and also partially remove the residual sacrificial patterns 25r between the gate interlayer dielectric patterns 30, and as a result, a third hole H3 may be formed to expose the top surface of the lower interlayer dielectric layer 20. The third hole H3 may expose sidewalls of the residual sacrificial patterns 25r and sidewalls of the gate interlayer dielectric patterns 30.

Figure 7M:
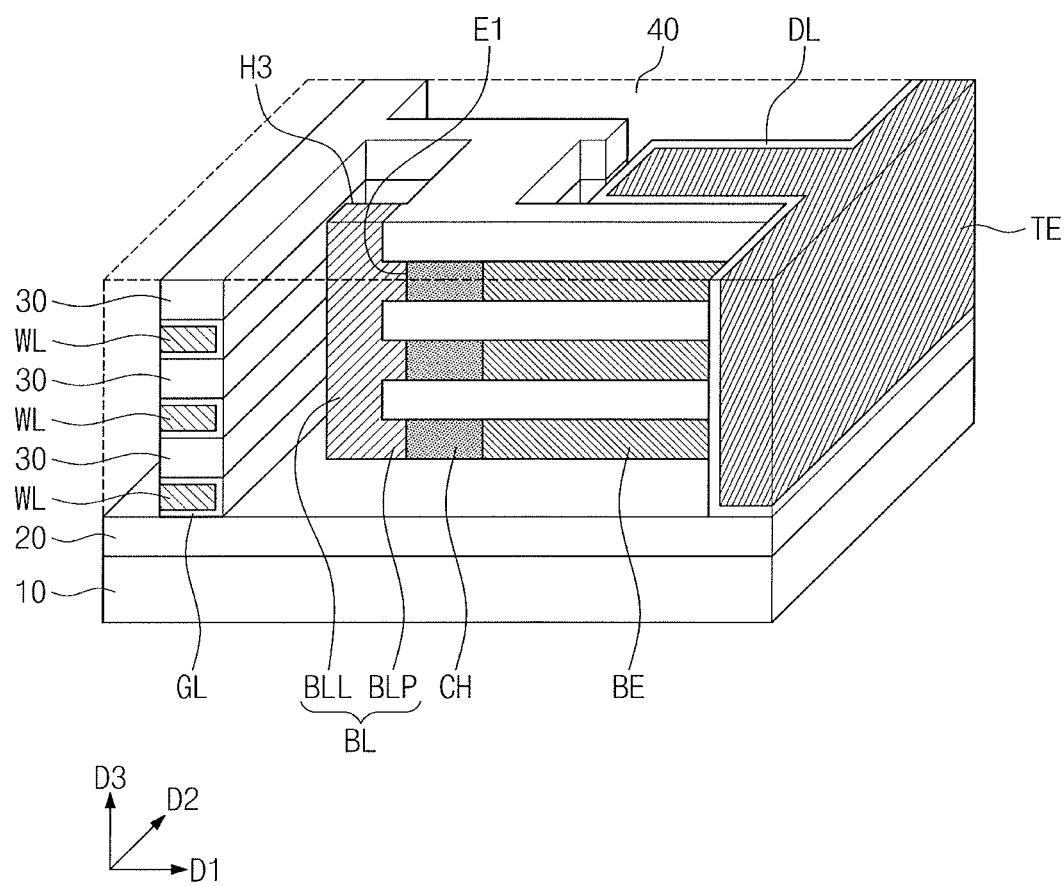

Referring to FIGS. 5, 7L, and 7M, the residual sacrificial patterns 25r exposed to the third hole H3 may be removed to expose the first ends E1 of the channel patterns CH. A conductive layer may be formed on the entire surface of the substrate 10 to thereby fill the third hole 143, and then a blanket etch-back process or a chemical mechanical polishing (CMP) process may be performed to expose the top surface of the gate interlayer dielectric pattern 30 at the top position and to form a bit line BL in the third hole H3. The bit line BL may be formed to contact the first ends E1 of the channel patterns CH. The processes mentioned above may fabricate the three-dimensional semiconductor device discussed with reference to FIGS. 4 to 6.

Figure 8:
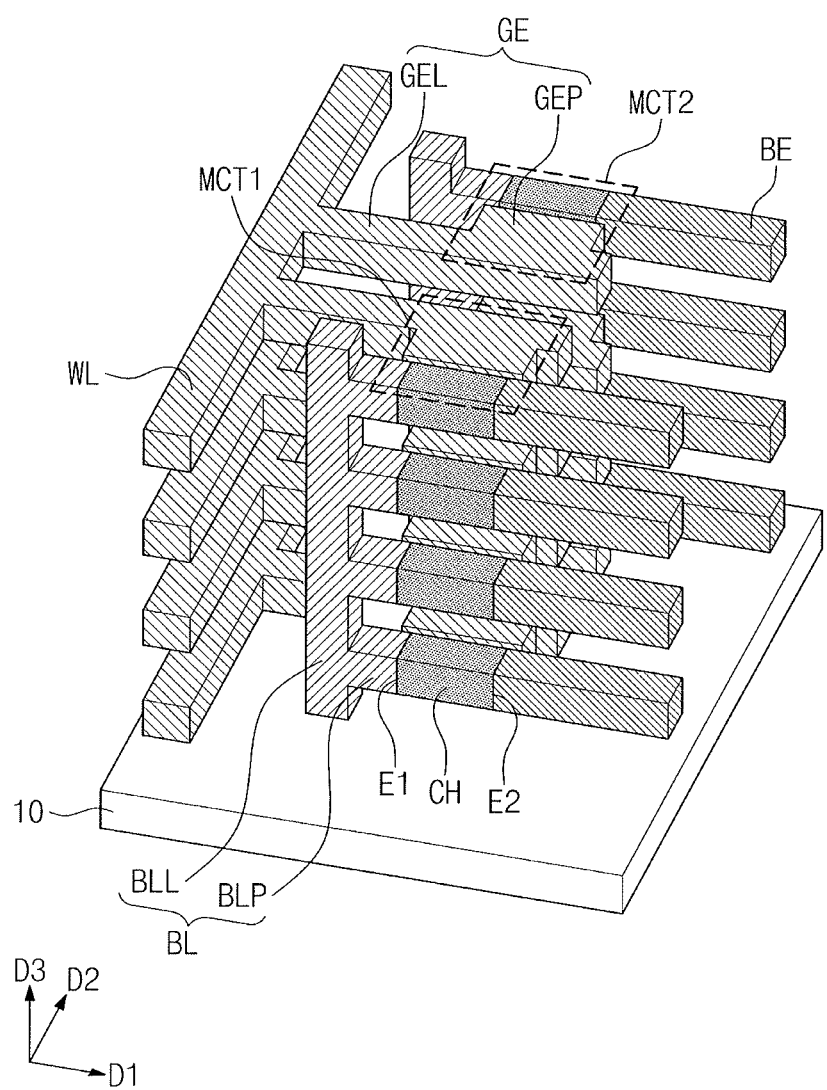
FIG. 8 illustrates a perspective view showing a three-dimensional semiconductor device according to some example embodiments.

FIG. 8 illustrates a perspective view showing a three-dimensional semiconductor device according to some example embodiments.

Referring to FIG. 8, a semiconductor device according to the present embodiment may be configured such that a plurality of gate electrodes GE are connected to a single word line WL at a certain height, and that the gate electrodes GE may have their shapes symmetrical with each other. The first memory cell transistor MCT1 may have a shape symmetrical with that of the second memory cell transistor MCT2 at a same height at which the first memory cell transistor MCT1 is located. The gate electrode GE included in the first memory cell transistor MCT1 may be positioned between the channel pattern CH included in the first memory cell transistor MCT1 and the gate electrode GE included in the second memory cell transistor MCT2. Other configurations may be identical or similar to those discussed with reference to FIGS. 4 to 6.

Figure 9:
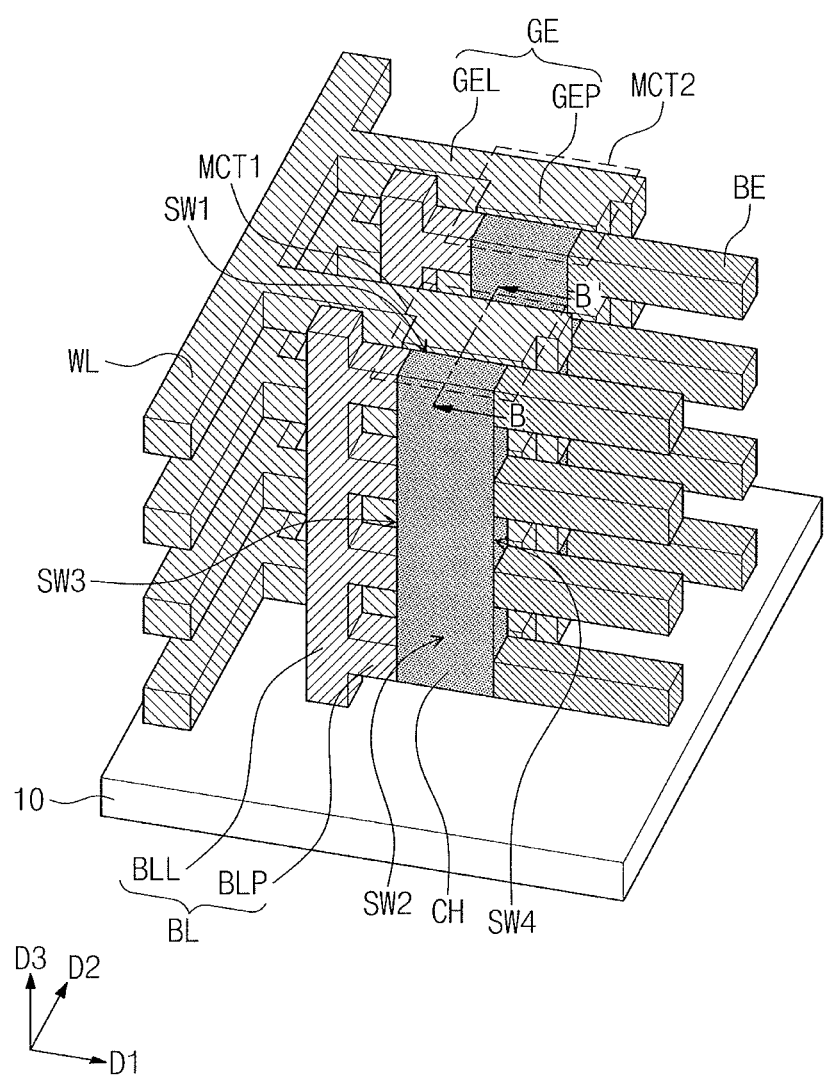
FIG. 9 illustrates a perspective view showing a three-dimensional semiconductor device according to some example embodiments.
Figure 10:
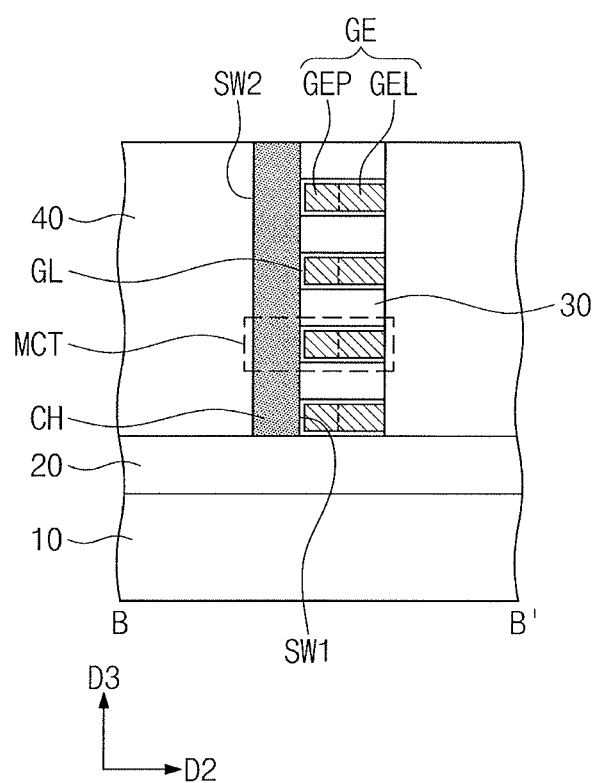
FIG. 10 illustrates a cross-sectional view taken along line B-B' of FIG. 9.

FIG. 9 illustrates a perspective view showing a three-dimensional semiconductor device according to some example embodiments. FIG. 10 illustrates a cross-sectional view taken along line B-B' of FIG. 9.

Referring to FIGS. 9 and 10, the channel pattern CH may extend in the third direction D3 and may be parallel to the bit line BL. The channel pattern CH may include the first sidewall SW1 and the second sidewall SW2 that are spaced apart from each other in the first direction D1, and also include a third sidewall SW3 and a fourth sidewall SW4 that are spaced apart from each other in the second direction D2. A plurality of gate electrodes GE at different heights may be adjacent to the first sidewall SW1 of one channel pattern CH. The gate dielectric layers GL may be interposed between corresponding gate electrodes GE and the one channel pattern CH. The third sidewall SW3 of the channel pattern CH may be in contact simultaneously with the bit-line protrusions BLP that are located at different heights and are connected to one bit-line line part BLL. The fourth sidewall SW4 of the channel pattern CH may be in contact simultaneously with a plurality of first electrodes BE at different heights. The channel pattern CH may include indium-gallium-zinc oxide (IGZO). The IGZO may serve as a channel at its portion adjacent to the gate electrode GE to which voltage is applied, but not serve as a channel at its portion adjacent to the gate electrode GE to which no voltage is applied. In a semiconductor device shown in FIGS. 9 and 10, even when the channel pattern CH is shared by the memory cell transistors MCT at different heights, no current leakage may occur between neighboring memory cell transistors MCT. Other configurations may be identical or similar to those discussed with reference to FIGS. 4 to 6.

Figure 11:
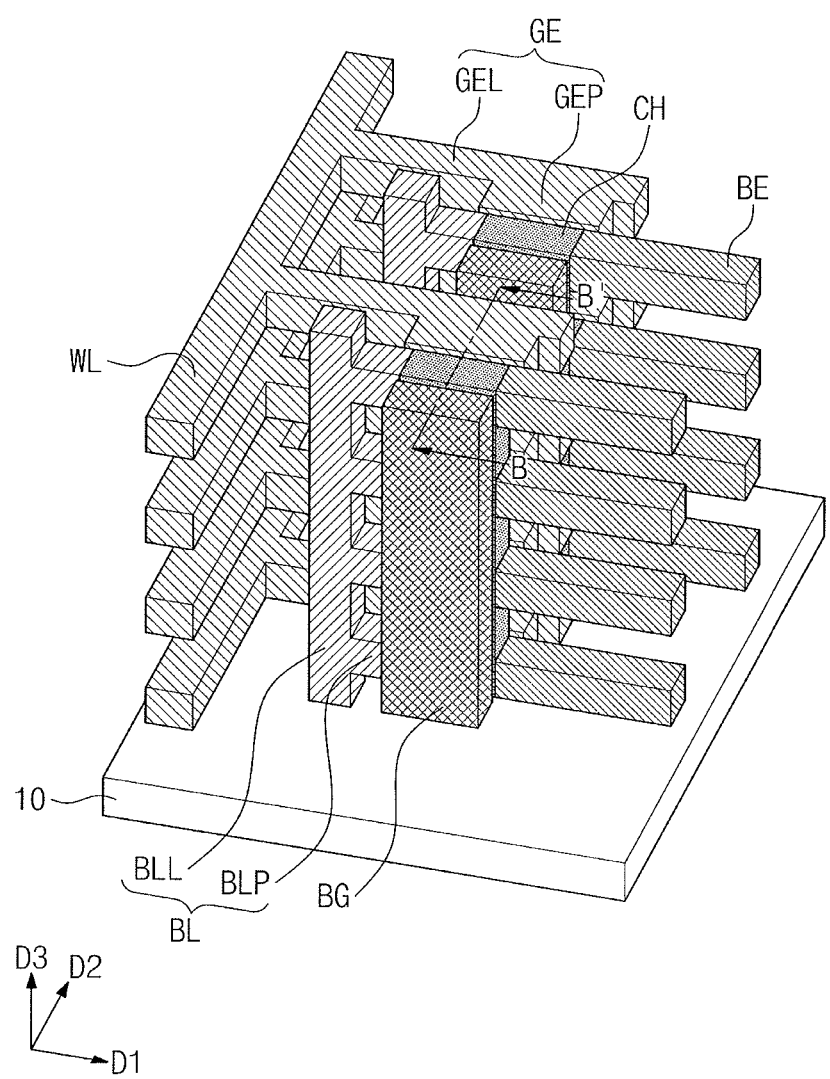
FIG. 11 illustrates a perspective view showing a three-dimensional semiconductor device according to some example embodiments.
Figure 12:
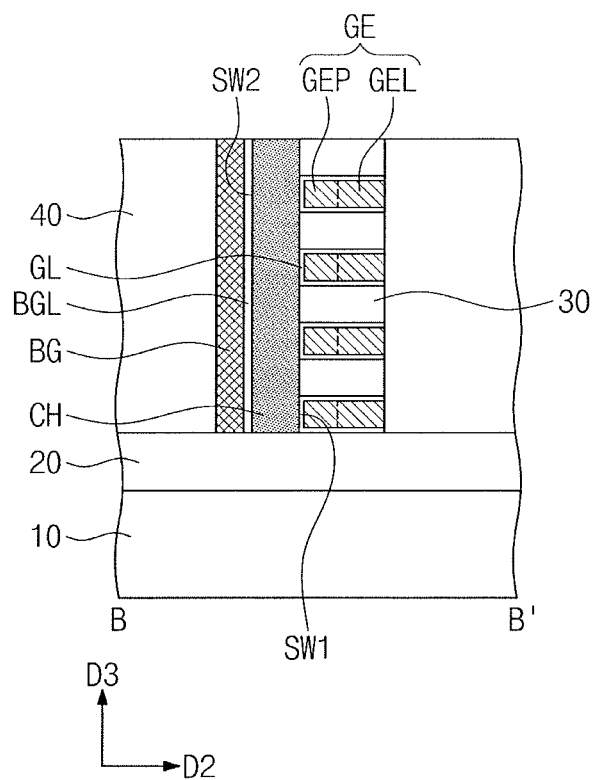
FIG. 12 illustrates a cross-sectional view taken along line B-B' of FIG. 11.

FIG. 11 illustrates a perspective view showing a three-dimensional semiconductor device according to some example embodiments. FIG. 12 illustrates a cross-sectional view taken along line B-B' of FIG. 11.

Referring to FIGS. 11 and 12, a semiconductor device according to the present embodiment may be similar to the semiconductor device of FIGS. 9 and 10, and may include a back gate line BG adjacent to the second sidewall SW2 of the channel pattern CH. The back gate line BG may also be called a back gate electrode. The back gate line BG may be parallel to the channel pattern CH and may extend in the third direction D3. The back gate line BG may be parallel to the bit line BL. A back gate dielectric layer BGL may be interposed between the back gate line BG and the channel pattern CH. The back gate dielectric layer BGL may include one or more of a silicon oxide layer and a high-k dielectric layer whose dielectric constant is greater than that of silicon oxide. The back gate dielectric layer BGL may be spaced apart from the substrate 10. The back gate line BG may be supplied with voltage different from that applied to at least one of the word lines WL. For example, a positive voltage may be applied to at least one of the word lines WL, and a negative voltage may be applied to the back gate line BG. The back gate line BG may prevent the occurrence of current leakage in an undesired direction within the channel pattern CH, and may assist to control the channel formation within the channel pattern CH. Other configurations may be identical or similar to those discussed with reference to FIGS. 9 and 10.

Figure 13:
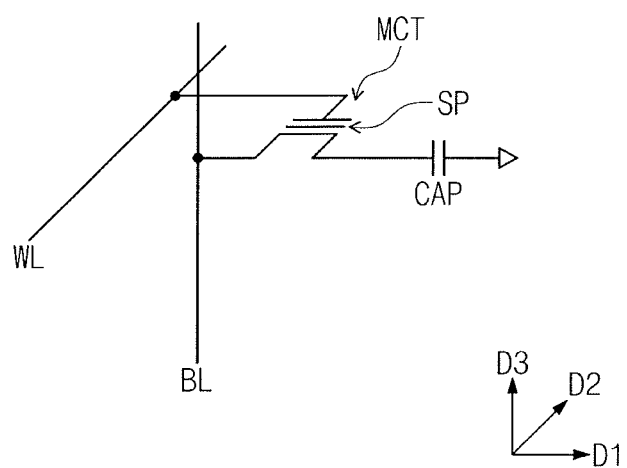
FIG. 13 illustrates a circuit diagram showing a three-dimensional semiconductor device according to some example embodiments.
Figure 14:
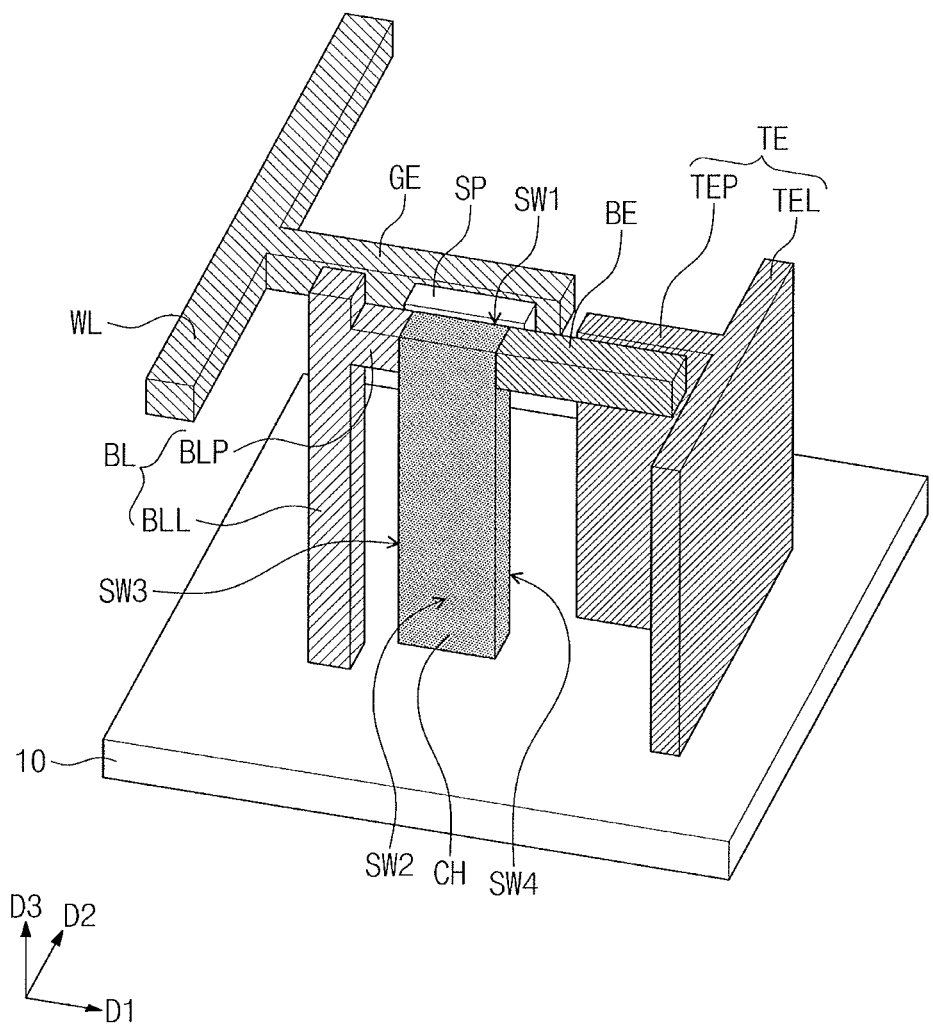
FIG. 14 illustrates a perspective view showing a three-dimensional semiconductor device according to some example embodiments.

FIG. 13 illustrates a circuit diagram showing a three-dimensional semiconductor device according to some example embodiments. FIG. 14 illustrates a perspective view showing a three-dimensional semiconductor device according to some example embodiments.

Referring to FIGS. 13 and 14, a semiconductor device according to the present embodiment may have a circuit in which a data storage pattern SP is interposed between a gate and a channel of the memory cell transistor MCT. For example, the semiconductor device according to the present embodiment may include a data storage pattern SP between the channel pattern CH and the gate electrode GE. The data storage pattern SP may include one of more of a floating gate electrode, a ferroelectric pattern, a phase-change material, and a silicon nitride layer. The data storage pattern SP may be spaced apart from both the gate electrode GE and the channel pattern CH. Alternatively, when the data storage pattern SP is a ferroelectric pattern, the data storage pattern SP may be in contact with one or more of the gate electrode GE and the channel pattern CH. The gate electrode GE may not include the gate protrusion GEP of FIG. 4, and may have a shape including only the gate line part GEL of FIG. 2. The channel pattern CH may extend in the third direction D3. The channel pattern CH may include a first sidewall SW1 and a second sidewall SW2 that are spaced apart from each other in the first direction D1, and also include a third sidewall SW3 and a fourth sidewall SW4 that are spaced apart from each other in the second direction D2. The fourth sidewall SW4 of the channel pattern CH may be in contact with the first electrode BE, or a portion of the capacitor CAP. Other configurations may be the same as those of FIGS. 1 and 2. The memory cell transistor MCT of FIG. 13 may be two-dimensionally or three-dimensionally arranged to constitute a memory cell array.

Figure 15:
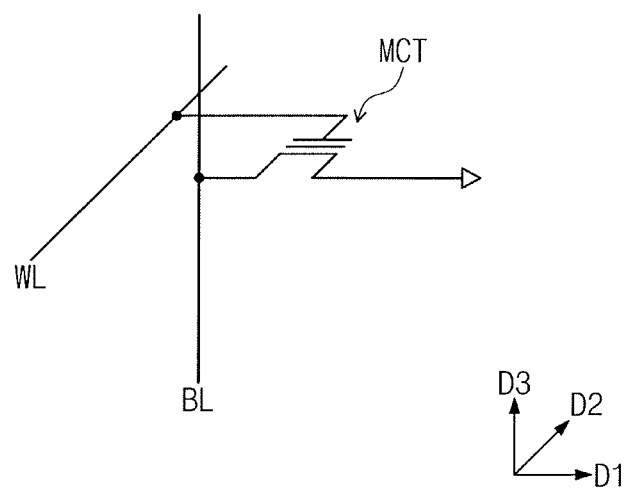
FIG. 15 illustrates a circuit diagram showing a three-dimensional semiconductor device according to some example embodiments.
Figure 16:
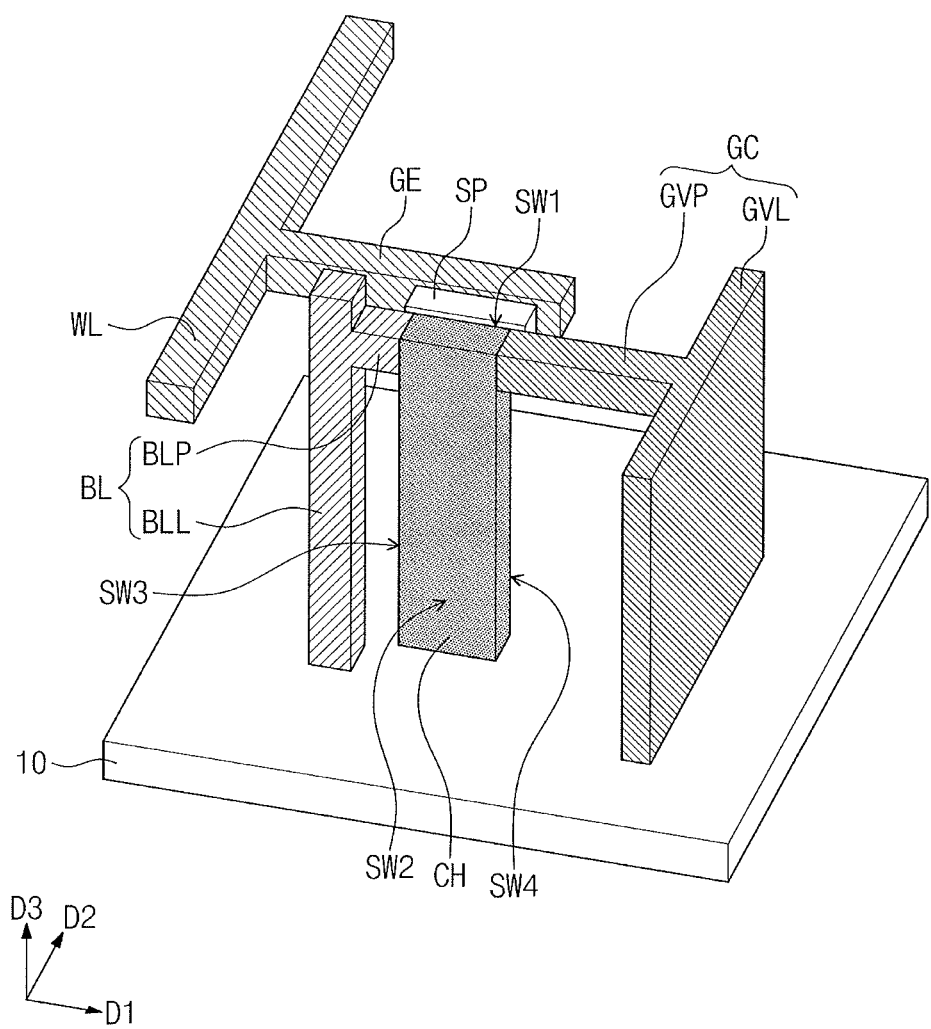
FIG. 16 illustrates a perspective view showing a three-dimensional semiconductor device according to some example embodiments.

FIG. 15 illustrates a circuit diagram showing a three-dimensional semiconductor device according to some example embodiments. FIG. 16 illustrates a perspective view showing a three-dimensional semiconductor device according to some example embodiments.

Referring to FIGS. 15 and 16, a semiconductor device according to the present embodiment may be the same as the semiconductor device of FIGS. 13 and 14, but may not include the capacitor CAP. For example, the fourth sidewall SW4 of the channel pattern CH may be in contact with a conductive pattern GC. The conductive pattern GC may include a conductive line part GVL that extends in the second direction D2, and also include at least one conductive protrusion GVP that extends from a sidewall of the conductive line part GVL toward the fourth sidewall SW4 of the channel pattern CH. The conductive pattern GC may be supplied with a power voltage or a ground voltage. Other configurations may be the same as those of FIGS. 13 and 14.

Figure 17:
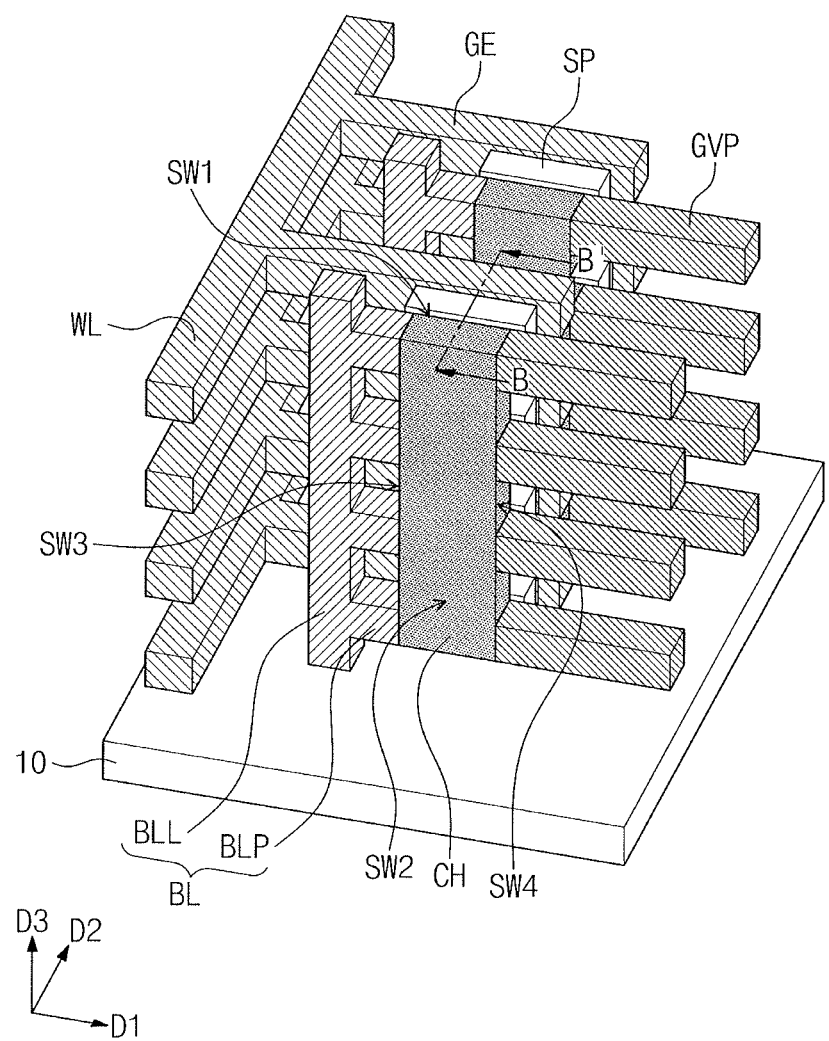
FIG. 17 illustrates a perspective view showing a three-dimensional semiconductor device according to some example embodiments.

FIG. 17 illustrates a perspective view showing a three-dimensional semiconductor device according to some example embodiments. FIGS. 18A to 18F illustrate cross-sectional views taken along line B-B' of FIG. 17.

Referring to FIG. 17, the channel pattern CH may extend in the third direction D3 and may be parallel to the bit line BL. The channel pattern CH may include a first sidewall SW1 and a second sidewall SW2 that are spaced apart from each other in the first direction D1, and also include a third sidewall SW3 and a fourth sidewall SW4 that are spaced apart from each other in the second direction D2. A plurality of gate electrodes GE at different heights may be adjacent to the first sidewall SW1 of one channel pattern CH. Data storage patterns SP may be interposed between corresponding gate electrodes GE and the first sidewall SW1 of the channel pattern CH. Other configurations may be the same as those of FIG. 9.

Figure 18A:
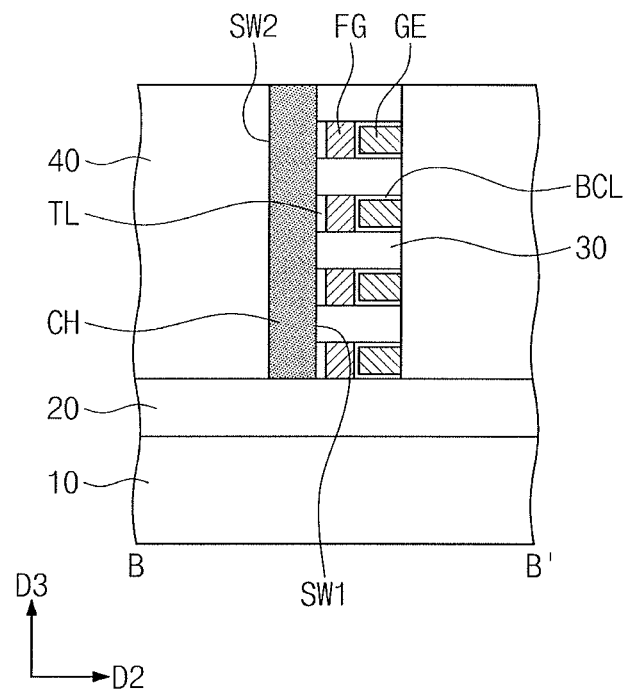
FIGS. 18A to 18F illustrate cross-sectional views along line B-B' of FIG. 17.

Referring to FIGS. 17 and 18A, the data storage patterns SP may each be a floating gate electrode FG. The floating gate electrode FG may include, e.g., an impurity-doped polysilicon pattern, an impurity-undoped polysilicon pattern, or a metal-containing layer. A blocking dielectric layer BCL may be interposed between the floating gate electrode FG and the gate electrode GE. The blocking dielectric layer BCL may include one or more of, e.g., a silicon oxide layer and a high-k dielectric layer whose dielectric constant is greater than that of silicon oxide. Tunnel dielectric layers TL may be interposed between corresponding floating gate electrodes FG and the channel pattern CH. The tunnel dielectric layer TL may include, e.g., a silicon oxide layer.

Figure 18B:
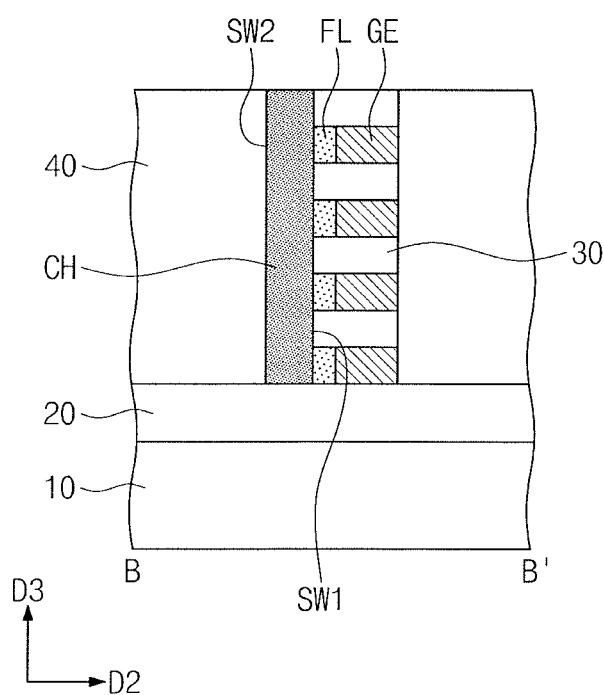

Referring to FIGS. 17 and 18B, the data storage patterns SP may each be a ferroelectric pattern FL. The ferroelectric patterns FL may include a ferroelectric material, e.g., one or more of lead zirconate titanate (PZT), lanthanum-modified lead zirconate titanate (PLZT), bismuth lanthanum titanate (BLT), barium strontium titanate (BST), and strontium bismuth tantalite (SBT), but embodiments are not limited thereto. For example, the PZT may be $Pb(Zr_xTi_{1-x})O_3$ (where, 0.2<x<0.8), the PLZT may be $(Pb_{1-y}La_y)(Zr_xTi_{1-x})O_3$ (where, 0.2<x<0.8 and 0.01<y<0.2), the BST may be $Ba_xSr_{1-x}TiO_3$ (where, 0.5<x<1), the SBT may be $Sr_xBi_yTa_2O_9$ (where, 0.5<x<1.5 and 1.5<y<3), but the embodiments are not limited thereto. The ferroelectric patterns FL may be in contact with corresponding gate electrodes GE. In addition, the ferroelectric patterns FL may be in contact with the channel pattern CH.

Figure 18C:
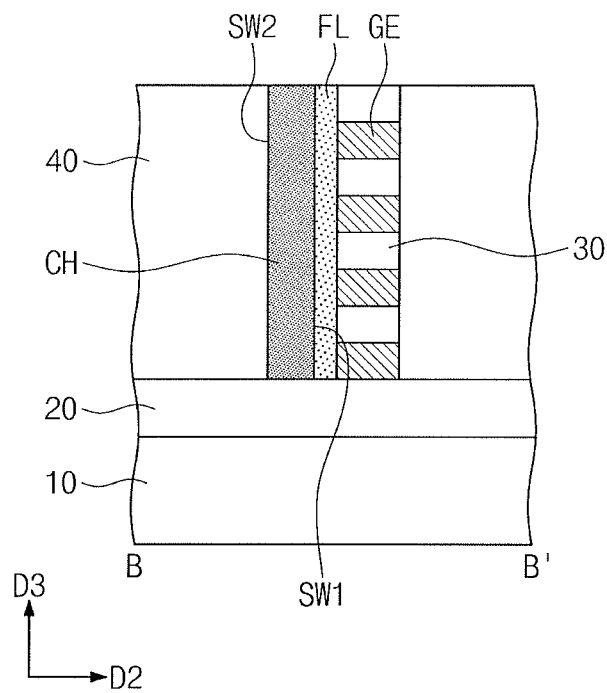

Referring to FIGS. 17 and 18C, the data storage pattern SP may be a ferroelectric pattern FL. The ferroelectric pattern FL may extend in the third direction D3 along the first sidewall SW1 of the channel pattern CH. The ferroelectric pattern FL may be in contact simultaneously with sidewalls of the gate electrodes GE and sidewalls of the gate interlayer dielectric patterns 30.

Figure 18D:
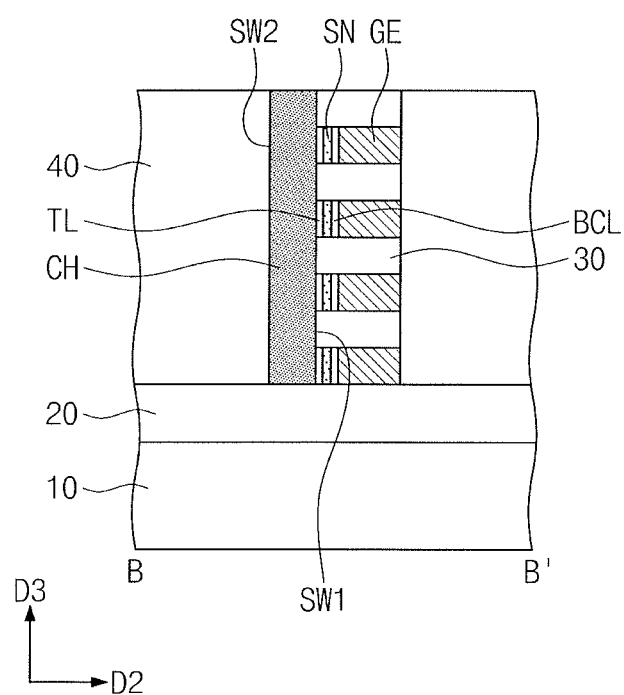

Referring to FIGS. 17 and 18D, the data storage patterns SP may each be a charge storage layer SN. The charge storage layer SN may include one or more of, e.g., a dielectric layer including conductive nano-dots, a silicon nitride layer, a silicon oxynitride layer, a silicon-rich nitride layer, a nano-crystalline silicon layer, and a laminated trap layer. Tunnel dielectric layers TL may be interposed between corresponding charge storage layers SN and the channel pattern CH. The tunnel dielectric layer TL may be a material having band gaps that are greater than that of the charge storage layer SN, e.g., may be formed of a silicon oxide layer. Blocking dielectric layers BCL may be correspondingly interposed between the data storage patterns SP and the gate electrodes GE. The blocking dielectric layer BCL may be one of, e.g., a silicon oxide layer and a high-k dielectric layer. The high-k dielectric layer may be one or more of, e.g., an aluminum oxide layer and a hafnium oxide layer. The gate interlayer dielectric pattern 30 may be interposed between the data storage patterns SP that are adjacent to each other in the third direction D3.

Figure 18E:
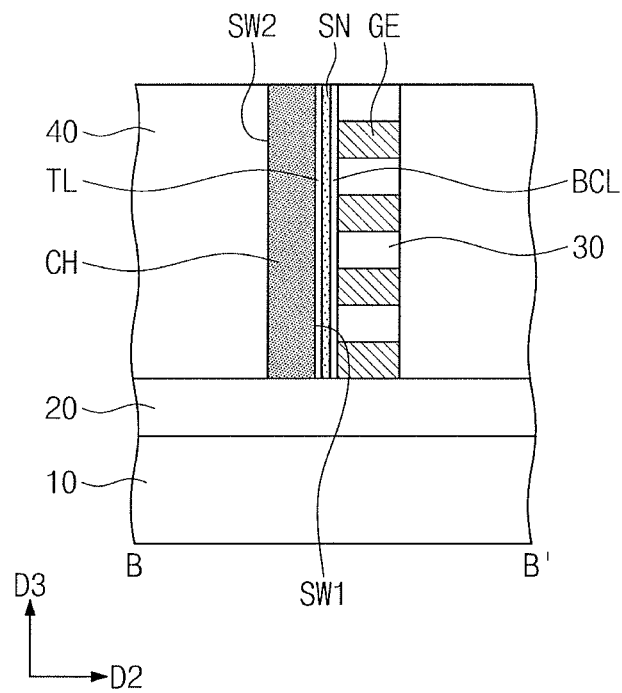

Referring to FIGS. 17 and 18E, the data storage pattern SP may be a silicon oxide layer. A tunnel dielectric layer TL may be interposed between the data storage pattern SP and the channel pattern CH. Blocking dielectric layers BCL may be interposed between corresponding data storage patterns SP and the gate electrodes GE. The data storage pattern SP, the tunnel dielectric layer TL, and the blocking dielectric layer BCL may extend in the third direction D3 and may entirely cover the first sidewall SW1 of the channel pattern CH.

Figure 18F:
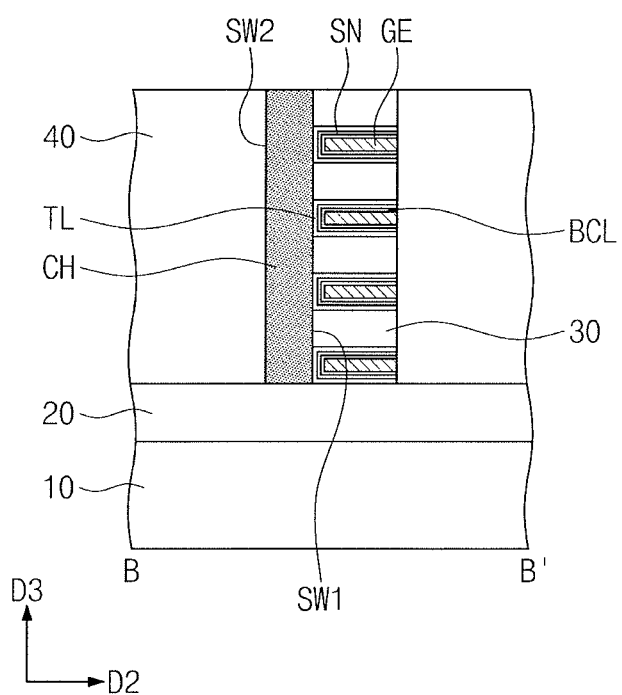

Referring to FIGS. 17 and 18F, the data storage patterns SP may each be a silicon oxide layer. Tunnel dielectric layers TL may be interposed between corresponding data storage patterns SP and the channel pattern CH. Blocking dielectric layers BCL may be correspondingly interposed between the data storage patterns SP and the gate electrodes GE. The data storage patterns SP, the tunnel dielectric layers TL, and the blocking dielectric layers BCL may extend to correspondingly intervene between the gate electrodes GE and the gate interlayer dielectric patterns 30.

Figure 19:
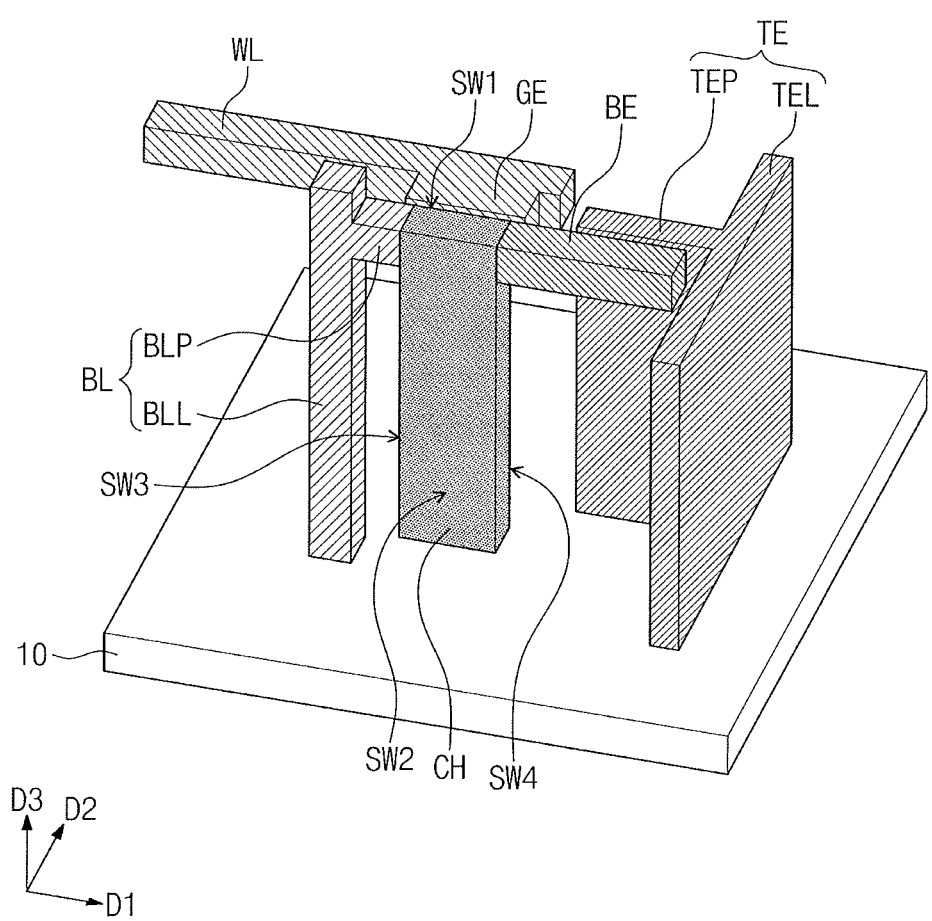
FIG. 19 illustrates a perspective view showing a three-dimensional semiconductor device according to some example embodiments.

FIG. 19 illustrates a perspective view showing a three-dimensional semiconductor device according to some example embodiments.

Referring to FIG. 19, a semiconductor device according to the present embodiment may be configured such that the channel pattern CH includes the first sidewall SW1 and the second sidewall SW2 that are spaced apart from each other in the first direction DE and also includes the third sidewall SW3 and the fourth sidewall SW4 that are spaced apart from each other in the second direction D2. The gate electrode GE may be adjacent to the first sidewall SW1 of the channel pattern CH. The gate electrode GE may be connected to the word line WL. The word line WL may extend in the first direction D1. The word line WL and the gate electrode GE may be integrally formed into a single body. The gate electrode GE may be a portion of the word line WL. Other configurations may be identical or similar to those discussed above with reference to FIG. 2.

Figure 20:
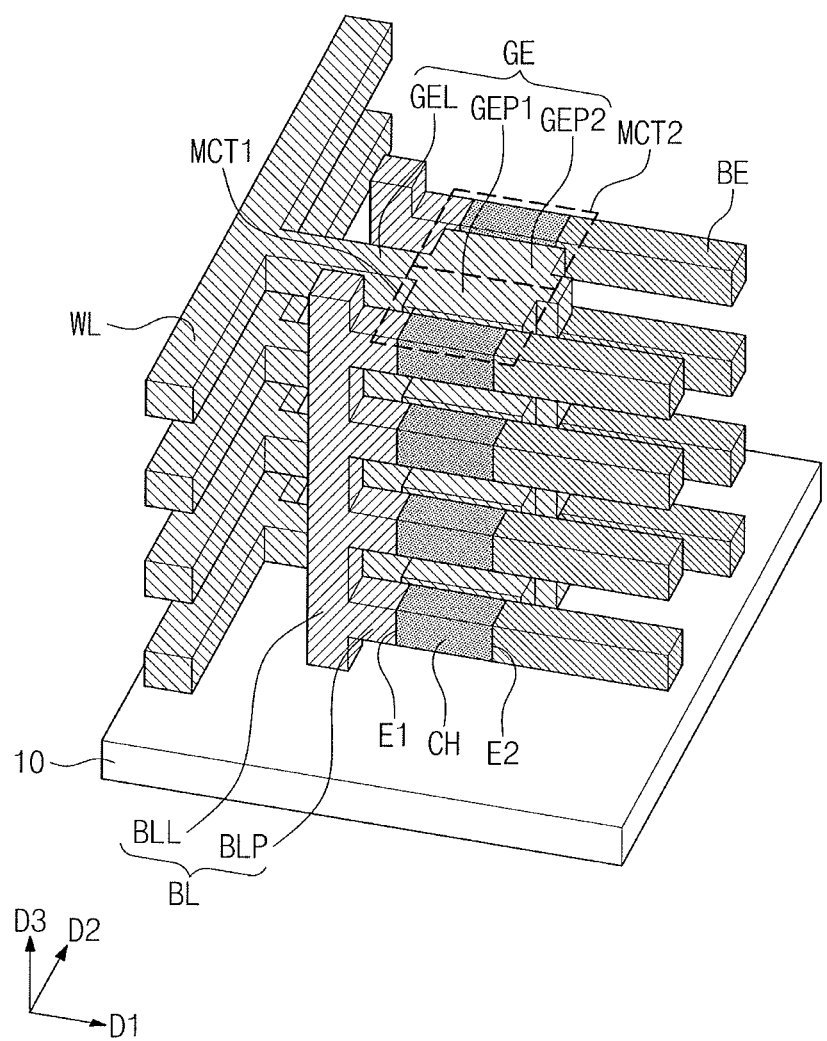
FIG. 20 illustrates a perspective view showing a three-dimensional semiconductor device according to some example embodiments.

FIG. 20 illustrates a perspective view showing a three-dimensional semiconductor device according to some example embodiments.

Referring to FIG. 20, a single gate electrode GE may be connected to one word line WL at a certain height. The gate electrode GE may include one gate line part GEL, and also include first and second gate protrusions GEP1 and GEP2 that protrude from opposite lateral surfaces of the gate line part GEL. The gate electrode GE according to the present embodiment may have a shape where neighboring gate electrodes GE of FIG. 8 are merged with each other. The channel pattern CH may be adjacent to each of first and second gate protrusions GEP1 and GEP2. For example, a single gate electrode GE may be positioned between neighboring channel patterns CH. The first gate protrusion GEP1 and its adjacent channel pattern CH may constitute a first memory cell transistor MCT1. The second gate protrusion GEP2 and its adjacent channel pattern CH may constitute a second memory cell transistor MCT2. Other configurations may be identical or similar to those discussed with reference to FIGS. 4 to 6.

By way of summation and review, example embodiments provide a three-dimensional semiconductor device with increased reliability. That is, a three-dimensional semiconductor device according to example embodiments includes bit lines perpendicular to a substrate, and thus may be minimized or prevented from signal disturbance and/or signal noise of the bit lines. In addition, a simplified connection may be provided between the bit line and a sense amplifier circuit. Further, a bit-line selection transistor may be configured to minimize loading through the bit line. In conclusion, the three-dimensional semiconductor device may increase in reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
   a first channel pattern on and spaced apart from a substrate, the first channel pattern including:
      a first end and a second end that are spaced apart from each other in a first direction parallel to a top surface of the substrate, and
      a first sidewall and a second sidewall connecting between the first end and the second end, the first and second sidewalls being spaced apart from each other in a second direction parallel to the top surface of the substrate, the second direction intersecting the first direction;
   a bit line in contact with the first end of the first channel pattern, the bit line extending in a third direction perpendicular to the top surface of the substrate; and
   a first gate electrode adjacent to the first sidewall of the first channel pattern,
   wherein the bit line includes:
      a bit-line line part perpendicular to the top surface of the substrate, and
      a bit-line protrusion that protrudes in the first direction from a sidewall of the bit-line line part, and
   wherein a length of the bit-line line part in the third direction is larger than a length of the bit-line protrusion in the first direction.

2. The device as claimed in claim 1, wherein the bit-line protrusion is in contact with the first end of the first channel pattern.

3. The device as claimed in claim 1, further comprising a second channel pattern at a same height as the first channel pattern, the second channel pattern being spaced apart from the first channel pattern,
   wherein the first gate electrode is between the first channel pattern and the second channel pattern, and
   wherein a distance between the first gate electrode and the first channel pattern is less than a distance between the first gate electrode and the second channel pattern.

4. The device as claimed in claim 3, further comprising a second gate electrode between the second channel pattern and the first gate electrode, the first gate electrode and the second gate electrode being symmetrical with respect to a line extending therebetween in the first direction.

5. The device as claimed in claim 1, further comprising a conductive pattern in contact with the second end of the first channel pattern, the conductive pattern being supplied with a power voltage or a ground voltage.

6. The device as claimed in claim 1, further comprising a back gate electrode adjacent to the second sidewall of the first channel pattern.

7. The device as claimed in claim 6, further comprising a word line on the substrate and connected to the first gate electrode, the back gate electrode extending in the third direction in parallel the bit line and intersecting the word line.

8. The device as claimed in claim 1, wherein:
   the first channel pattern extends in the third direction and is parallel to the bit line, and
   the device further comprises a second gate electrode that is adjacent to the first sidewall of the first channel pattern and is spaced apart from the first gate electrode in the third direction.

9. The device as claimed in claim 8, wherein:
   the bit-line protrusion includes a first bit-line protrusion and a second bit-line protrusion, the first bit-line protrusion and the second bit-line protrusion being spaced apart from each other in the third direction,
   the first bit-line protrusion is adjacent to the first gate electrode, and
   the second bit-line protrusion is adjacent to the second gate electrode.

10. The device as claimed in claim 1, further comprising a word line on the substrate, the word line extending in the second direction and being at a same height as the first electrode is located, and the first gate electrode extending in the first direction to contact the word line.

11. The device as claimed in claim 10, wherein the first gate electrode includes:
    a gate line part that extends in the first direction and contacts the word line; and
    a first gate protrusion that protrudes from a first sidewall of the gate line part toward the first sidewall of the first channel pattern.

12. The device as claimed in claim 11, wherein:
    the first gate electrode further includes a second gate protrusion that protrudes toward a second sidewall of the gate line part, the second sidewall of the gate line part facing the first sidewall of the gate line part, and
    the device further comprises a second channel pattern that is adjacent to the second gate protrusion and is spaced apart from the first channel pattern.

13. A three-dimensional semiconductor device, comprising:
    a channel pattern that extends in a first direction perpendicular to a top surface of a substrate, the channel pattern including:
       a first sidewall and a second sidewall that are spaced apart from each other in a second direction intersecting the first direction, the second direction being parallel to the top surface of the substrate, and
       a third sidewall and a fourth sidewall that are spaced apart from each other in a third direction intersecting the second direction, the third direction being parallel to the top surface of the substrate;
    gate electrodes that are adjacent to the first sidewall of the channel pattern and are spaced apart from each other in the first direction; and
    a bit line that contacts the third sidewall of the channel pattern and extends in the first direction, the bit line including:
       a bit-line line part that is spaced apart from the channel pattern and extends in the first direction, and
       bit-line protrusions that protrude from a sidewall of the bit-line line part toward the third sidewall of the channel pattern,
    wherein a length of the bit-line line part in the first direction is larger than a length of each of the bit-line protrusions in a direction from the sidewall of the bit-line line part toward the third sidewall of the channel pattern.

14. The device as claimed in claim 13, wherein the bit-line protrusions are spaced apart from each other in the first direction.

15. The device as claimed in claim 13, further comprising word lines that are connected to corresponding gate electrodes and extend either in the second direction or in the third direction.

16. The device as claimed in claim 15, further comprising a back gate line that is adjacent to the second sidewall of the channel pattern and extends in the first direction.

17. The device as claimed in claim 13, further comprising at least one of a gate dielectric layer and a data storage pattern, the at least one of the gate dielectric layer and the data storage pattern being interposed between the channel pattern and a corresponding one of the gate electrodes.

18. The device as claimed in claim 13, further comprising data storage patterns or conductive patterns, the data storage patterns or the conductive patterns being in contact with the fourth sidewall of the first channel pattern and spaced apart from each other in the first direction.

19. A three-dimensional semiconductor device, comprising:
- a first bit line and a second bit line that extend in a first direction perpendicular to a top surface of a substrate and are spaced apart from each other in a second direction parallel to the top surface of the substrate;
- a word line at a predetermined height from the top surface of the substrate, the word line extending in the second direction;
- a first channel pattern on the top surface of the substrate and at a same height as the word line, the first channel pattern being in contact with the first bit line; and
- a second channel pattern on the top surface of the substrate and at a same height as the word line, the second channel pattern being in contact with the second bit line, wherein the word line includes a first word-line protrusion between the first channel pattern and the second channel pattern, and wherein the first word-line protrusion is closer to the first channel pattern than to the second channel pattern.

20. The device as claimed in claim 19, wherein:

the word line further includes a second word-line protrusion between the first word-line protrusion and the second channel pattern, and the first word-line protrusion and the second word-line protrusion are symmetrical with respect to a line extending therebetween in a third direction perpendicular to the first and second directions.

* * * * *